(12) United States Patent
Mima et al.

(10) Patent No.: US 11,828,811 B2
(45) Date of Patent: Nov. 28, 2023

(54) STORAGE BATTERY INSPECTION DEVICE AND STORAGE BATTERY INSPECTION METHOD

(71) Applicant: Integral Geometry Science Inc., Hyogo (JP)

(72) Inventors: Yuki Mima, Hyogo (JP); Shogo Suzuki, Hyogo (JP); Kenjiro Kimura, Hyogo (JP); Noriaki Kimura, Hyogo (JP)

(73) Assignee: INTEGRAL GEOMETRY SCIENCE INC., Hyogo (JP)

( * ) Notice: Subject to any disclaimer, the term of this patent is extended or adjusted under 35 U.S.C. 154(b) by 93 days.

(21) Appl. No.: 17/620,884

(22) PCT Filed: Jul. 28, 2020

(86) PCT No.: PCT/JP2020/028885
§ 371 (c)(1),
(2) Date: Dec. 20, 2021

(87) PCT Pub. No.: WO2021/024859
PCT Pub. Date: Feb. 11, 2021

(65) Prior Publication Data
US 2022/0349943 A1 Nov. 3, 2022

(30) Foreign Application Priority Data
Aug. 6, 2019 (JP) .................. 2019-144620

(51) Int. Cl.
*G01R 31/385* (2019.01)
*G01R 31/36* (2020.01)
(Continued)

(52) U.S. Cl.
CPC ....... *G01R 31/385* (2019.01); *G01R 31/3644* (2013.01); *G01R 31/389* (2019.01);
(Continued)

(58) Field of Classification Search
CPC ............ G01R 33/0017; G01R 31/3644; G01R 33/1215; G01R 31/392; G01R 31/396;
(Continued)

(56) References Cited

U.S. PATENT DOCUMENTS

2003/0164765 A1 9/2003 Sumi et al.
2018/0147942 A1* 5/2018 Iida .................... G01R 31/3842
(Continued)

FOREIGN PATENT DOCUMENTS

EP 0 544 911 6/1993
JP 2003-255029 9/2003
(Continued)

OTHER PUBLICATIONS

International Search Report dated Oct. 6, 2020 in International (PCT) Application No. PCT/JP2020/028885.
(Continued)

*Primary Examiner* — Lee E Rodak
*Assistant Examiner* — Trung Q Nguyen
(74) *Attorney, Agent, or Firm* — Wenderoth, Lind & Ponack, L.L.P.

(57) ABSTRACT

A storage battery inspection device includes: an energy storage control circuit that applies an alternating current to a storage battery; a magnetic sensor that senses a magnetic field component outside the storage battery and outputs a magnetic sensor signal indicating the sensed component; a canceling coil that generates a magnetic field component based on an input current to cancel out a magnetic field component generated by magnetization of a magnetic material in the storage battery; a feedback circuit that obtains, from the magnetic sensor signal, a low-frequency signal indicating a magnetic field component having a lower frequency than the alternating current, and applies the input current to the canceling coil based on the low-frequency
(Continued)

signal; and a detection circuit that obtains, from the magnetic sensor signal, a detection signal indicating a magnetic field component having the same frequency as the alternating current.

16 Claims, 14 Drawing Sheets

(51) Int. Cl.
*H01M 10/42* (2006.01)
*G01R 31/389* (2019.01)
*G01R 31/396* (2019.01)
*G01R 33/00* (2006.01)
*G01R 33/09* (2006.01)
*G01R 31/392* (2019.01)

(52) U.S. Cl.
CPC ....... *G01R 31/396* (2019.01); *G01R 33/0017* (2013.01); *G01R 33/0041* (2013.01); *G01R 33/091* (2013.01); *H01M 10/4285* (2013.01); *G01R 31/392* (2019.01)

(58) Field of Classification Search
CPC ... G01R 31/389; G01R 31/385; H01M 10/48; H01M 10/4285; Y02E 60/10
USPC ...... 324/416, 425–434, 500, 522, 713, 72.5, 324/76.11, 76.39, 76.77, 98, 111, 120
See application file for complete search history.

(56) References Cited

U.S. PATENT DOCUMENTS

2019/0120796 A1\* 4/2019 Kimura .................. G01N 27/72
2022/0283201 A1\* 9/2022 Saito .................. G01R 33/0017

FOREIGN PATENT DOCUMENTS

| JP | 2013-32985 | | 2/2013 | |
|---|---|---|---|---|
| JP | 2013-54984 | A \* | 3/2013 | ............. G01R 33/02 |

OTHER PUBLICATIONS

Extended European Search Report dated Jul. 28, 2023 in European Application No. 20849027.6.

\* cited by examiner

STORAGE BATTERY INSPECTION DEVICE AND STORAGE BATTERY INSPECTION METHOD

TECHNICAL FIELD

The present disclosure relates to a storage battery inspection device and the like that inspects storage batteries.

BACKGROUND ART

Patent Literature (PTL) 1 discloses a technique related to an evaluation device that inspects secondary batteries. With the technique disclosed in PTL 1, a controller calculates the magnitudes of a plurality of currents flowing in a plurality of portions of a secondary battery from a magnetic field detected by a magnetic sensor, and extracts the magnitudes of the plurality of currents in an electrolyte region located between electrodes. The controller then creates a graph illustrating the distribution of the magnitudes of the plurality of currents and displays the graph on a display device. Note that a secondary battery is also referred to as a storage battery.

CITATION LIST

Patent Literature

[PTL 1] Japanese Unexamined Patent Application Publication No. 2013-32985

SUMMARY OF INVENTION

Technical Problem

However, a storage battery may include an electrode plate or the like made out of a magnetic material. The magnetic sensor may therefore not be able to properly sense a magnetic field component generated by the current flowing between the electrodes due to the magnetization of the magnetic material included in the storage battery. It may therefore be difficult to properly inspect storage batteries using magnetic sensors.

In view of this, the present disclosure provides a storage battery inspection device and the like that can properly inspect a storage battery using a magnetic sensor, even when the storage battery includes magnetic material.

Solution to Problem

A storage battery inspection device according to one aspect of the present disclosure inspects a storage battery and includes: an energy storage control circuit that applies an alternating current to the storage battery by applying an external voltage in which an alternating voltage is superimposed on a direct voltage for balancing an output voltage of the storage battery; a magnetic sensor that senses a magnetic field component outside the storage battery and outputs a magnetic sensor signal indicating the sensed magnetic field component; a canceling coil that generates a magnetic field component based on an input current to cancel out a magnetic field component generated by magnetization of a magnetic material included in the storage battery; a feedback circuit that obtains, from the magnetic sensor signal output from the magnetic sensor while the alternating current is being applied to the storage battery, a low-frequency signal indicating a magnetic field component having a frequency lower than a frequency of the alternating current, and applies the input current to the canceling coil based on the low-frequency signal; and a detection circuit that obtains, from the magnetic sensor signal output from the magnetic sensor while the alternating current is being applied to the storage battery and the input current is being applied to the canceling coil, a detection signal indicating a magnetic field component having a same frequency as the frequency of the alternating current.

These general or specific aspects may be implemented as a system, a device or apparatus, a method, an integrated circuit, a computer program, or a non-transitory computer-readable recording medium such a CD-ROM, or any combination thereof.

Advantageous Effects of Invention

According to one aspect of the present disclosure, a storage battery can be properly inspected using a magnetic sensor, even when the storage battery includes magnetic material.

DESCRIPTION OF EMBODIMENTS

Figure 1:
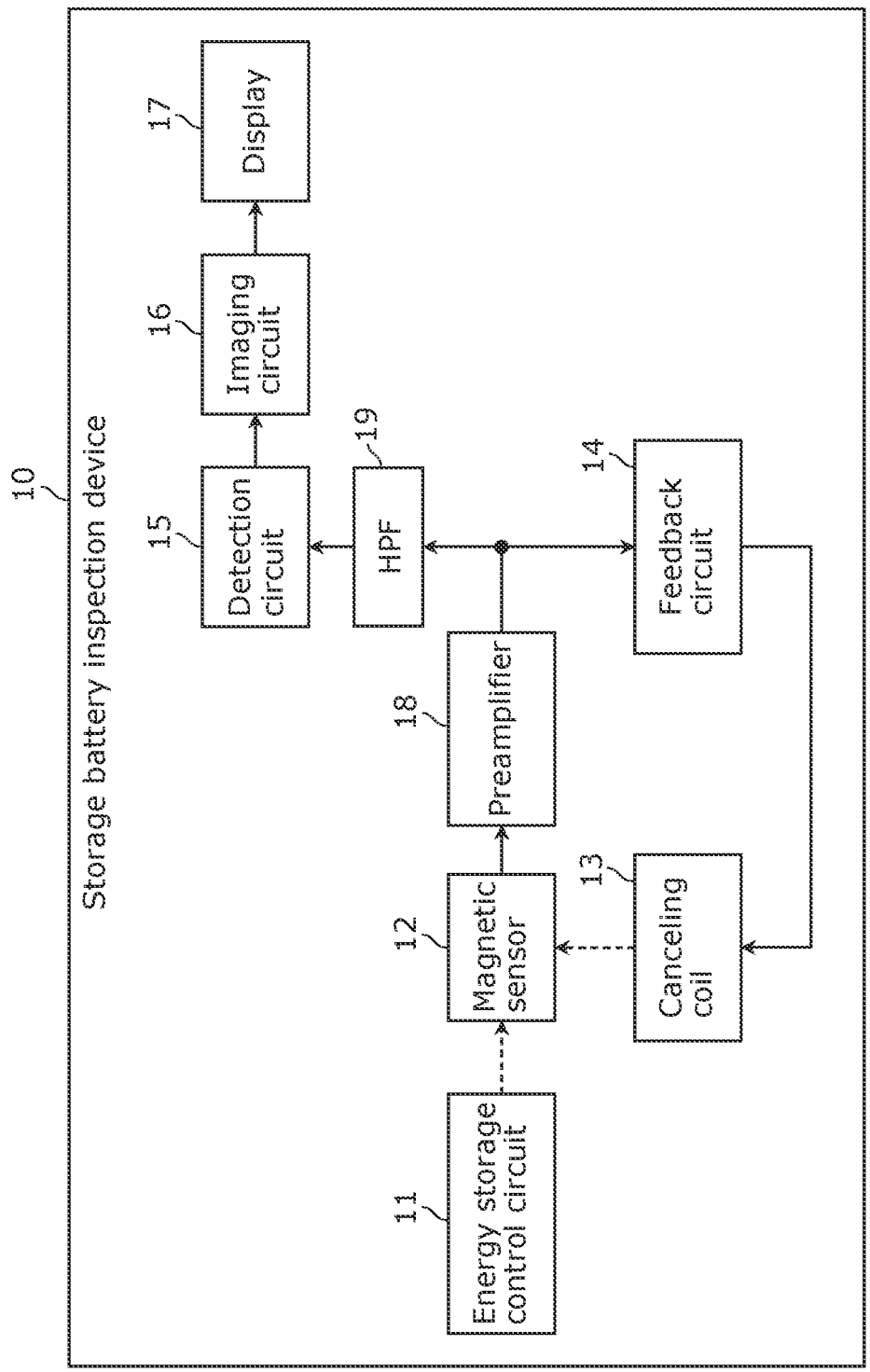
FIG. 1 is a block diagram illustrating the configuration of a storage battery inspection device according to an embodiment of the present disclosure.

A storage battery inspection device according to one aspect of the present disclosure inspects a storage battery and includes: an energy storage control circuit that applies an alternating current to the storage battery by applying an external voltage in which an alternating voltage is superimposed on a direct voltage for balancing an output voltage of the storage battery; a magnetic sensor that senses a magnetic field component outside the storage battery and outputs a magnetic sensor signal indicating the sensed magnetic field component; a canceling coil that generates a magnetic field component based on an input current to cancel out a magnetic field component generated by magnetization of a magnetic material included in the storage battery; a feedback circuit that obtains, from the magnetic sensor signal output from the magnetic sensor while the alternating current is being applied to the storage battery, a low-frequency signal indicating a magnetic field component having a frequency lower than a frequency of the alternating current, and applies the input current to the canceling coil based on the low-frequency signal; and a detection circuit that obtains, from the magnetic sensor signal output from the magnetic sensor while the alternating current is being applied to the storage battery and the input current is being applied to the canceling coil, a detection signal indicating a magnetic field component having a same frequency as the frequency of the alternating current.

This enables the storage battery inspection device to properly cancel out a magnetic field component having a frequency lower than the frequency of the alternating current flowing in the storage battery as a magnetic field component generated by the magnetization of the magnetic material included in the storage battery. The storage battery inspection device can therefore properly sense a magnetic field component generated by the alternating current flowing in the storage battery. Accordingly, the storage battery inspection device can properly inspect a storage battery using a magnetic sensor, even when the storage battery includes magnetic material.

For example, the feedback circuit obtains the low-frequency signal from the magnetic sensor signal via a low-pass filter that blocks components having frequencies higher than a cutoff frequency and passes components having frequencies lower than the cutoff frequency, and the cutoff frequency is lower than the frequency of the alternating current.

This enables the storage battery inspection device to properly obtain a low-frequency signal indicating a magnetic field component having a frequency lower than the frequency of the alternating current flowing in the storage battery via the low-pass filter.

For example, the cutoff frequency is at least $\frac{1}{10}$th of the frequency of the alternating current.

This enables the storage battery inspection device to properly obtain a low-frequency signal indicating a magnetic field component having a frequency lower than the frequency of the alternating current flowing in the storage battery while inhibiting a processing delay in the low-pass filter.

For example, the feedback circuit uses a proportional-integral-differential (PID) control method to control a magnitude of the input current to bring a strength of the magnetic field component indicated by the low-frequency signal closer to a target value, and applies the input current of the controlled magnitude to the canceling coil.

This enables the storage battery inspection device to properly control a magnetic field component having a frequency lower than the frequency of the alternating current flowing in the storage battery via feedback control based on the PID control method.

For example, the target value is zero.

This enables the storage battery inspection device to bring the strength of a magnetic field component having a frequency lower than the frequency of the alternating current applied to the storage battery closer to zero. In other words, this enables the storage battery inspection device to properly cancel out a magnetic field component having a frequency lower than the frequency of the alternating current flowing in the storage battery via feedback control based on the PID control method.

For example, the feedback circuit includes: a signal processing circuit that obtains the low-frequency signal from the magnetic sensor signal output from the magnetic sensor while the alternating current is being applied to the storage battery, and outputs a control signal indicating a magnitude of the input current based on the low-frequency signal; and a current amplifying circuit that applies the input current of the magnitude indicated by the control signal to the canceling coil.

This enables the storage battery inspection device to properly control the input current applied to the canceling coil.

For example, the signal processing circuit converts the magnetic sensor signal output from the magnetic sensor as an analog signal into a digital signal, obtains the low-frequency signal from the magnetic sensor signal converted into a digital signal, generates the control signal based on the low-frequency signal, converts the generated control signal into an analog signal, and outputs the control signal converted into an analog signal.

This enables the storage battery inspection device to control the input current with high accuracy via signal processing based on a digital signal.

For example, the signal processing circuit obtains the low-frequency signal from the magnetic sensor signal output from the magnetic sensor as an analog signal without converting the magnetic sensor signal output from the magnetic sensor as an analog signal into a digital signal, generates the control signal based on the low-frequency signal, and outputs the generated control signal.

This enables the storage battery inspection device to control the input current at high speed with an analog signal.

For example, the magnetic sensor is positioned inside the canceling coil.

This enables the storage battery inspection device to properly generate a magnetic field component at the position of the magnetic sensor to cancel out the magnetic field component generated by the magnetization of the magnetic material included in the storage battery.

For example, the magnetic sensor is positioned outside the canceling coil.

This enables the storage battery inspection device to generate a magnetic field component at a distance from the magnetic sensor to cancel out the magnetic field component generated by the magnetization of the magnetic material included in the storage battery. This configuration allows for more flexible positioning of the canceling coil.

For example, the magnetic sensor is positioned in a region on a central axis of the canceling coil.

This enables the storage battery inspection device to generate a magnetic field component in a direction toward the magnetic sensor to cancel out the magnetic field component generated by the magnetization of the magnetic material included in the storage battery. Accordingly, the storage battery inspection device can generate a magnetic field component in the vicinity of the magnetic sensor to cancel out the magnetic field component generated by the magnetization of the magnetic material included in the storage battery.

For example, the magnetic sensor is positioned in a region other than a region on a central axis of the canceling coil.

This enables the storage battery inspection device to generate, at a distance from the magnetic sensor, a magnetic field component in a flexibly definable direction as a magnetic field component to cancel out the magnetic field component generated by the magnetization of the magnetic material included in the storage battery.

For example, a central axis of the canceling coil is perpendicular to a planar electrode plate included in the storage battery.

This enables the storage battery inspection device to generate a magnetic field component in a direction toward the storage battery to cancel out the magnetic field component generated by the magnetization of the magnetic material included in the storage battery. This also enables the storage battery inspection device to generate a magnetic field component in a direction perpendicular to the planar electrode plates included in the storage battery as a magnetic field component to cancel out the magnetic field component generated by the magnetization of the magnetic material included in the storage battery.

For example, a central axis of the canceling coil is parallel to a planar electrode plate included in the storage battery.

This enables the storage battery inspection device to generate a magnetic field component in a direction parallel to the planar electrode plates included in the storage battery as a magnetic field component to cancel out the magnetic field component generated by the magnetization of the magnetic material included in the storage battery. It is assumed that a magnetic field component in a direction parallel to the planar electrode plates is generated outside the storage battery to which the alternating current is applied. The storage battery inspection device can therefore properly sense the magnetic field component generated outside the storage battery to which the alternating current is applied by canceling out the magnetic field component generated by the magnetization of the magnetic material of the storage battery.

For example, the storage battery inspection device includes: a plurality of magnetic sensors as the magnetic sensor; and a plurality of canceling coils respectively corresponding to the plurality of magnetic sensors, as the canceling coil. The feedback circuit obtains, for the plurality of magnetic sensors, the low-frequency signal from the magnetic sensor signal output from the magnetic sensor, and applies, based on the low-frequency signal, the input current to the canceling coil corresponding to the magnetic sensor among the plurality of canceling coils.

This enables the storage battery inspection device to properly sense a wide range of magnetic field components in a short period of time.

For example, a storage battery inspection method according to one aspect of the present disclosure is a method of inspecting a storage battery and includes: applying an alternating current to the storage battery by applying an external voltage in which an alternating voltage is superimposed on a direct voltage for balancing an output voltage of the storage battery; while the alternating current is being applied to the storage battery, sensing a magnetic field component outside the storage battery and obtaining, from a magnetic sensor signal output by a magnetic sensor and indicating the sensed magnetic field component, a low-frequency signal indicating a magnetic field component having a frequency lower than a frequency of the alternating current; applying an input current based on the low-frequency signal to a canceling coil that generates a magnetic field component based on the input current to cancel out a magnetic field component generated by magnetization of a magnetic material included in the storage battery; and obtaining, from the magnetic sensor signal output from the magnetic sensor while the alternating current is being applied to the storage battery and the input current is being applied to the canceling coil, a detection signal indicating a magnetic field component having a same frequency as the frequency of the alternating current.

This makes it possible to properly cancel out a magnetic field component having a frequency lower than the frequency of the alternating current flowing in the storage battery as a magnetic field component generated by the magnetization of the magnetic material included in the storage battery. It is therefore possible to properly sense a magnetic field component generated by the alternating current flowing in the storage battery. Accordingly, a storage battery can be properly inspected using a magnetic sensor, even when the storage battery includes magnetic material.

Hereinafter, embodiments will be described with reference to the drawings. Each of the following embodiments describes a general or specific example. The numerical values, shapes, materials, elements, the arrangement and connection of the elements, steps, the order of the steps etc., presented in the following embodiments are mere examples, and do not limit the scope of the claims.

As used herein, the term "storage battery" refers to a battery that can be charged and discharged, which is also referred to as a secondary battery. Moreover, the term "magnetic field component" refers to a component of a magnetic field. A magnetic field component may be a component corresponding to a spatial position, a component corresponding to a frequency, a component corresponding to a predetermined direction, or a component corresponding to any combination of these. For convenience, hereinafter, a magnetic field component may be referred to simply as a magnetic field.

Moreover, as used herein, the phrase "cancel out the magnetic field component" is not limited to completely canceling the magnetic field component, but may also mean inhibiting the magnetic field component, such as almost canceling the magnetic field component, or partially canceling the magnetic field component.

EMBODIMENT

First, an overview of the storage battery inspection device according to the present embodiment will be given. The storage battery inspection device according to the present embodiment inspects batteries without destroying them. X-ray, visible light, and microwaves may be used as technical elements for such non-destructive inspection. However, it is difficult to inspect the electrical state in a storage battery using X-ray, visible light, or microwaves. The storage battery inspection device according to the present embodiment therefore uses information on the magnetic field.

More specifically, the current flowing inside the storage battery generates a magnetic field around the storage battery (outside the storage battery). The relationship between the current (J) and the magnetic field (H) in the steady-state is expressed as $\Delta H = -(\nabla \times J)$ based on Maxwell's equations. Based on this relationship, it is possible to estimate the current that flows inside the storage battery from the magnetic field outside the storage battery. The storage battery inspection device according to the present embodiment inspects the electrical state of a storage battery by measuring the magnetic field.

The electrical state in the storage battery, however, changes during the charging/discharging processes. Observing the state of a storage battery as it changes during the charging/discharging processes is useful for inspecting the reliability of the storage battery. However, since it takes a proportionate amount of time to measure the magnetic field, the electrical state in the storage battery may change while the magnetic field is being measured during the charging/discharging processes of the storage battery. Since the magnetic field also changes when the electrical state in the storage battery changes, it is difficult to properly measure the magnetic field.

Here, it is possible to stop the electrical state in the storage battery from changing by stopping the charging/discharging of the storage battery. However, in a state in which the charging/discharging is simply stopped, no current flows in the storage battery, and the magnetic field component corresponding to the electrical state in the storage battery is not generated. It is therefore not appropriate to measure the magnetic field in a state in which charging/discharging is simply stopped.

There is a possibility that magnetic material may be used for the electrodes and other components of the storage battery. The magnetization of this magnetic material included in the storage battery also generates a magnetic field component. The strength of the magnetic field component generated by the magnetization of the magnetic material included in the storage battery may be significantly greater than the strength of the magnetic field component generated by the current flowing in the storage battery. For example, the strength of the magnetic field component generated by the magnetization of the magnetic material included in the storage battery is assumed to be around a few millitesla, and the strength of the magnetic field component generated by the current flowing in the storage battery is assumed to be a few microtesla or less.

In such cases, the magnetic sensor for measuring the magnetic field reacts strongly to the magnetic field component generated by the magnetization of the magnetic material included in the storage battery. It is therefore difficult to detect the minute magnetic field components generated by the current flowing in the storage battery with high accuracy.

In view of this, the storage battery inspection device according to the present embodiment first applies an alternating current to the storage battery. This enables the storage battery inspection device to flow alternating current through the storage battery while pausing (inhibiting) the charging/discharging of the storage battery during the charging/discharging processes. The alternating current flowing in the storage battery generates a magnetic field component outside the storage battery as well.

Furthermore, the storage battery inspection device according to the present embodiment uses a canceling coil to cancel out a magnetic field component having a frequency lower than the frequency of the alternating current. This enables the storage battery inspection device to cancel out the magnetic field component generated by the magnetization of the magnetic material included in the storage battery while maintaining the magnetic field component generated by the alternating current applied to the storage battery.

The storage battery inspection device according to the present embodiment can therefore properly sense a magnetic field component generated by the alternating current applied to the storage battery, and can properly inspect the electrical state of the storage battery. Hereinafter, the configuration of the storage battery inspection device according to the present embodiment will be described in greater detail.

FIG. 1 is a block diagram illustrating the configuration of the storage battery inspection device according to the present embodiment. Storage battery inspection device 10 illustrated in FIG. 1 includes energy storage control circuit 11, magnetic sensor 12, preamplifier 18, canceling coil 13, feedback circuit 14, high-pass filter (HPF) 19, detection circuit 15, imaging circuit 16, and display 17.

Energy storage control circuit 11 is a circuit that applies voltage and current to the storage battery. More specifically, energy storage control circuit 11 applies an alternating current to the storage battery by applying an external voltage in which the alternating voltage is superimposed on the direct voltage for balancing the output voltage of the storage battery.

Magnetic sensor 12 is a sensor that senses a magnetic field component. More specifically, magnetic sensor 12 senses a magnetic field component outside the storage battery and outputs a magnetic sensor signal indicating the sensed magnetic field component. For example, the strength of the magnetic sensor signal output from magnetic sensor 12 is proportional to the strength of the magnetic field component sensed by magnetic sensor 12.

Preamplifier 18 is a circuit that amplifies minute signals. This provides signals that can be used in later-stage circuits (such as feedback circuit 14 and high-pass filter 19). For example, preamplifier 18 amplifies the magnetic sensor signal output from magnetic sensor 12 and outputs the amplified magnetic sensor signal. In the present disclosure, the magnetic sensor signal output from magnetic sensor 12 may be a magnetic sensor signal output from magnetic sensor 12 and amplified by preamplifier 18.

Canceling coil 13 is a circuit that generates a magnetic field component based on the input current. More specifically, canceling coil 13 generates a magnetic field component based on the input current to cancel out the magnetic field component generated by the magnetization of the magnetic material included in the storage battery.

Feedback circuit 14 is a circuit that applies an input current to canceling coil 13 based on the magnetic sensor signal output from magnetic sensor 12. More specifically, feedback circuit 14 obtains, from the magnetic sensor signal output from magnetic sensor 12 while the alternating current is being applied to the storage battery, a low-frequency signal indicating a magnetic field component having a frequency lower than the frequency of the alternating current.

For example, the strength of the low-frequency signal is proportional to the strength of the magnetic field component having a frequency lower than the frequency of the alternating current. The low-frequency signal may indicate one or more magnetic field components of part or all of frequencies lower than the frequency of the alternating current. More specifically, the low-frequency signal may indicate a magnetic field component having a frequency lower than a reference frequency lower than the frequency of the alternating current. The low-frequency signal may also indicate a magnetic field component corresponding to a direct current component.

Feedback circuit 14 then applies an input current to canceling coil 13 based on the low-frequency signal. More specifically, feedback circuit 14 applies a greater input current to canceling coil 13 the greater the low-frequency signal obtained from the magnetic sensor signal is, i.e., the greater the magnetic field component having a frequency lower than the frequency of the alternating current is.

High-pass filter 19 is a filter that blocks components having frequencies lower than the cutoff frequency and passes components having frequencies higher than the cutoff frequency. A frequency lower than the frequency of the alternating current applied to storage battery 31 is used as the cutoff frequency of high-pass filter 19. This removes, from the magnetic sensor signal, components having frequencies lower than the frequency of the alternating current applied to storage battery 31, i.e., lower than the cutoff frequency.

Here, blocking components having frequencies lower than the cutoff frequency means inhibiting the passage of components having frequencies lower than the cutoff frequency, and is not limited to completely blocking components having frequencies lower than the cutoff frequency. Similarly, passing components having frequencies higher than the cutoff frequency means inhibiting the blocking of components having frequencies higher than the cutoff frequency, and is not limited to completely passing components having frequencies higher than the cutoff frequency. The degree of blocking and passing depends on the quality of high-pass filter 19.

High-pass filter 19 may block or pass components that are the same as the cutoff frequency, or block part of the components that are the same as the cutoff frequency and pass the other part.

In the present disclosure, the magnetic sensor signal output from magnetic sensor 12 may be a magnetic sensor signal output from magnetic sensor 12 and removed of low-frequency components by high-pass filter 19. This magnetic sensor signal is input into detection circuit 15.

Detection circuit 15 is a circuit that performs detection. For example, detection circuit 15 performs phase detection. More specifically, detection circuit 15 obtains, as a detection signal, a signal indicating a magnetic field component having the same frequency as the frequency of the alternating current applied to the storage battery. More specifically, detection circuit 15 obtains, from the magnetic sensor signal output from magnetic sensor 12 while the alternating current is being applied to the storage battery and the input current is being applied to canceling coil 13, a detection signal indicating a magnetic field component having the same frequency as the frequency of the alternating current.

For example, the strength of the detection signal is proportional to the strength of the magnetic field component having the same frequency as the frequency of the alternating current.

Imaging circuit 16 is a circuit that generates images. More specifically, imaging circuit 16 generates an image showing the state of the storage battery based on the detection signal obtained by detection circuit 15. As used herein, an image can also be a video.

Display 17 is a device (information display circuit) that displays images. More specifically, display 17 includes a screen and displays an image generated by imaging circuit 16 on the screen.

Storage battery inspection device 10 may include only some of the elements from among energy storage control circuit 11, magnetic sensor 12, canceling coil 13, feedback circuit 14, detection circuit 15, imaging circuit 16, and display 17. Stated differently, storage battery inspection device 10 need not include all of these elements. For example, display 17 may be included in a device other than storage battery inspection device 10, and imaging circuit 16 and display 17 may be included in a device other than storage battery inspection device 10.

Storage battery inspection device 10 need not include preamplifier 18, need not include high-pass filter 19, and need not include either of them. For example, the magnetic sensor signal output from magnetic sensor 12 may be input to feedback circuit 14 and detection circuit 15 without going through preamplifier 18 or high-pass filter 19.

Two or more of the elements included in storage battery inspection device 10 may be implemented in a single circuit. These circuits are not limited to dedicated circuits, and may be general-purpose circuits. In particular, the circuit that performs the information processing may be a general-purpose circuit such as a processor that executes a program or the like corresponding to the processing described above.

Figure 2:
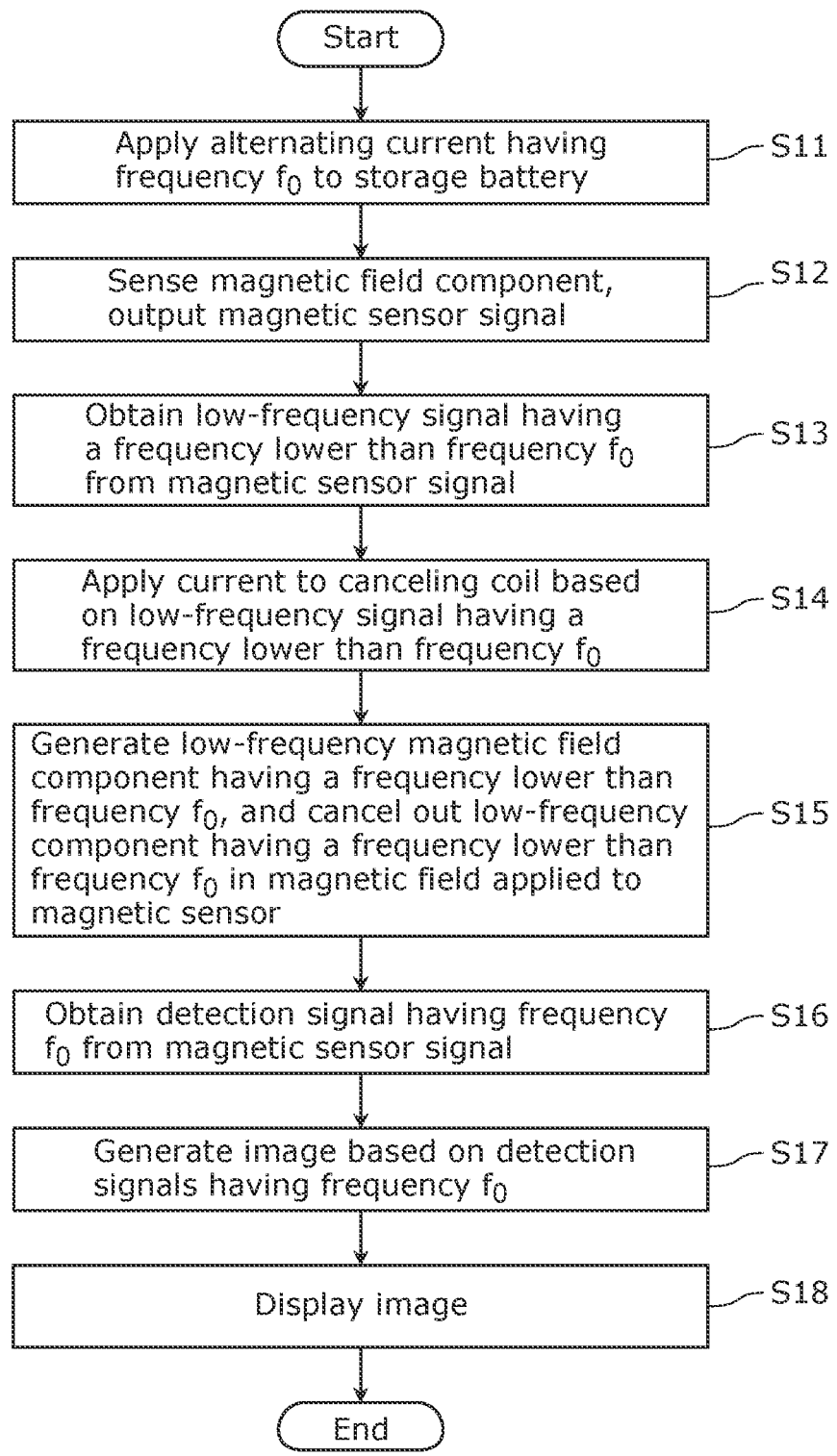
FIG. 2 is a flowchart illustrating an operation of the storage battery inspection device according to an embodiment of the present disclosure.

FIG. 2 is a flowchart illustrating an operation of storage battery inspection device 10 illustrated in FIG. 1. More specifically, the elements of storage battery inspection device 10 illustrated in FIG. 1 perform the operation illustrated in FIG. 2.

First, energy storage control circuit 11 applies an alternating current having frequency $f_0$ to the storage battery (S11). More specifically, energy storage control circuit 11 applies an alternating current to the storage battery by applying an external voltage in which the alternating voltage is superimposed on the direct voltage for balancing the output voltage of the storage battery.

While the alternating current is being applied to the storage battery, magnetic sensor 12 senses the magnetic field component and outputs a magnetic sensor signal indicating the sensed magnetic field component (S12).

Feedback circuit 14 obtains a low-frequency signal having a frequency lower than frequency $f_0$ from the magnetic sensor signal (S13). More specifically, feedback circuit 14 obtains, from the magnetic sensor signal output from magnetic sensor 12, a low-frequency signal indicating a magnetic field component having a frequency lower than frequency $f_0$ of the alternating current. Feedback circuit 14 then applies an input current to canceling coil 13 based on the low-frequency signal that is lower than frequency $f_0$ (S14).

Canceling coil 13 generates a magnetic field component based on the input current. More specifically, canceling coil 13 generates a low-frequency magnetic field component having a frequency lower than frequency $f_0$, and cancels out a low-frequency component having a frequency lower than frequency $f_0$ in the magnetic field applied to magnetic sensor 12 (S15). Detection circuit 15 obtains a detection signal having frequency $f_0$ from the magnetic sensor signal (S16). More specifically, detection circuit 15 obtains, from the magnetic sensor signal output from magnetic sensor 12, a detection signal indicating a magnetic field component having the same frequency as frequency $f_0$ of the alternating current.

Energy storage control circuit 11, magnetic sensor 12, canceling coil 13, feedback circuit 14 and detection circuit 15 continuously perform the above processes in parallel. While the alternating current is being applied to the storage battery and the input current is being applied to canceling coil 13, magnetic sensor 12 senses the magnetic field component at each of a plurality of positions around the storage battery and outputs a magnetic sensor signal indicating the sensed magnetic field component.

Detection circuit 15 obtains the magnetic sensor signal output from magnetic sensor 12 at each of the plurality of positions around the storage battery while the alternating current is being applied to the storage battery and the input current is being applied to canceling coil 13, and obtains a detection signal from the magnetic sensor signal.

Imaging circuit 16 generates, for example after the detection signals have been obtained at all positions, an image showing the state of the storage battery based on the detection signals having frequency $f_0$ (S17). Display 17 then displays the generated image (S18).

Figure 3:
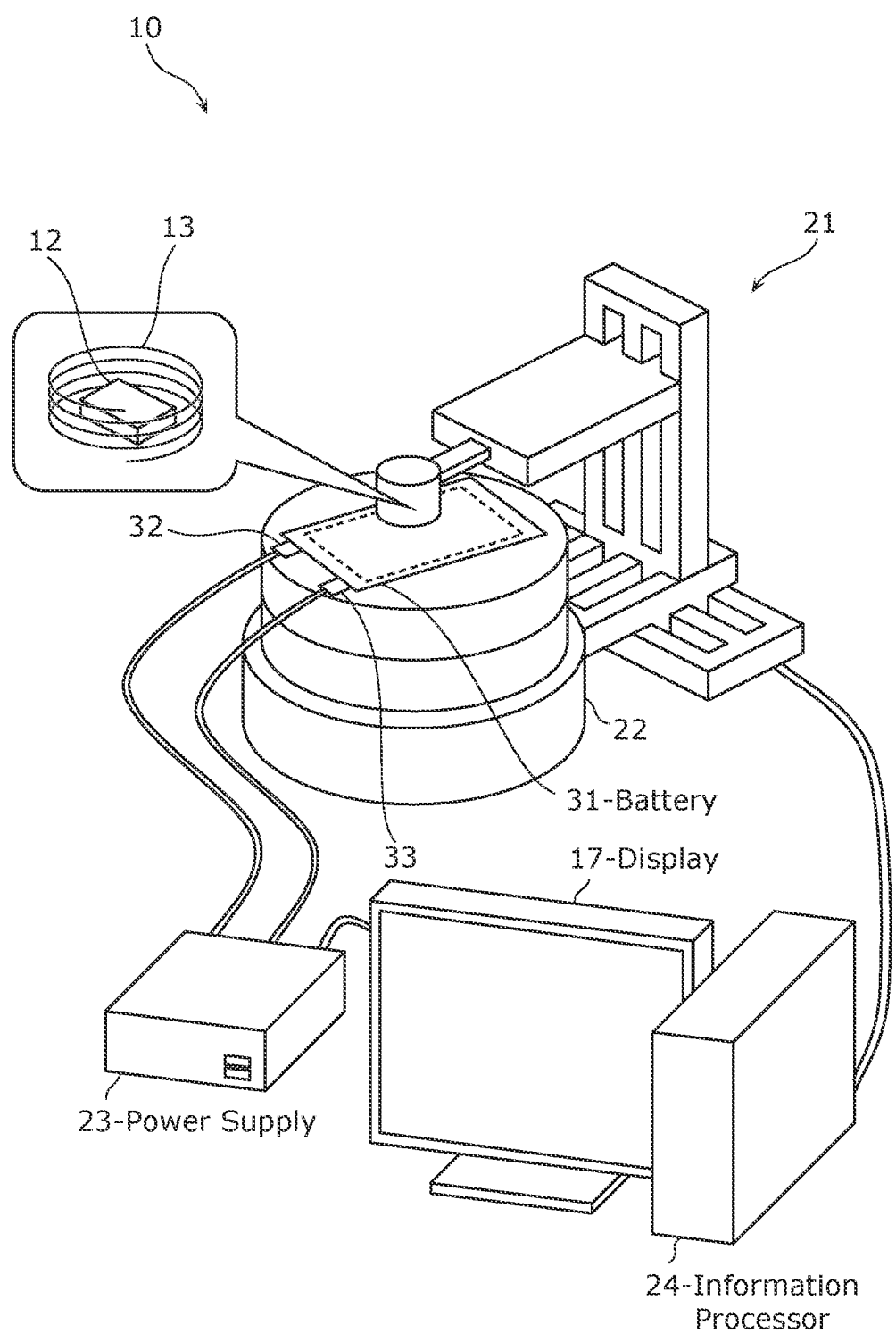
FIG. 3 is a schematic diagram illustrating the configuration of the storage battery inspection device according to an embodiment of the present disclosure in detail.

FIG. 3 is a schematic diagram illustrating the configuration of storage battery inspection device 10 illustrated in FIG. 1 in detail. FIG. 3 illustrates storage battery inspection device 10 and storage battery 31. Storage battery inspection device 10 illustrated in FIG. 3 corresponds to a specific example of storage battery inspection device 10 illustrated in FIG. 1, and includes measurer 21, power supply 23, display 17, and information processor 24.

For example, energy storage control circuit 11 is included in power supply 23, and imaging circuit 16 is included in information processor 24. Each of feedback circuit 14 and detection circuit 15 may be included in measurer 21, may be included in information processor 24, and may be distributed among measurer 21 and information processor 24.

Measurer 21 includes magnetic sensor 12 as a probe, and includes canceling coil 13 in a location near magnetic sensor 12. Measurer 21 measures the magnetic field via magnetic sensor 12. Measurer 21 includes a slidable mechanism implemented as, for example, an actuator. This allows measurer 21 to scan the vicinity of storage battery 31 using magnetic sensor 12.

Measurer 21 also includes rotating table 22. Rotating table 22 is a table for placing storage battery 31, which is the object to be inspected, and includes a rotatable mechanism implemented as, for example, an actuator. This allows measurer 21 to scan the vicinity of storage battery 31 using magnetic sensor 12 from various rotation angles.

For example, magnetic sensor 12 is located inside the space surrounded by canceling coil 13, and as magnetic sensor 12 moves, canceling coil 13 also moves.

Here, storage battery 31 is rotated by rotating table 22, but measurer 21 may scan the vicinity of storage battery 31 at various rotation angles by rotating around storage battery 31. Moreover, measurer 21 may rotate magnetic sensor 12.

Power supply 23 is a device that applies voltage and current to storage battery 31. More specifically, power supply 23 applies an alternating current to storage battery 31 by applying an external voltage in which the alternating voltage is superimposed on the direct voltage for balancing the output voltage of storage battery 31. Power supply 23 may be a function generator. In the example illustrated in FIG. 3, power supply 23 applies voltage and current to storage battery 31 via conductive wires.

Information processor 24 is a device that performs information processing. For example, information processor 24 is a computer.

More specifically, information processor 24 may apply an input current to canceling coil 13 based on the magnetic sensor signal output from magnetic sensor 12 via measurer 21 or the like. Information processor 24 may thereupon obtain, from the magnetic sensor signal output from magnetic sensor 12 while the alternating current is being applied to storage battery 31, a low-frequency signal indicating a magnetic field component having a frequency lower than the frequency of the alternating current. Information processor 24 may then apply an input current to canceling coil 13 based on the low-frequency signal.

For example, information processor 24 may perform a detection process. More specifically, information processor 24 obtains, from the magnetic sensor signal output from magnetic sensor 12 while the alternating current is being applied to storage battery 31 and the input current is being applied to canceling coil 13, a detection signal indicating a magnetic field component having the same frequency as the frequency of the alternating current.

For example, information processor 24 may generate an image showing the state of storage battery 31 based on the detection signal. Information processor 24 may also display the generated image on display 17.

Storage battery 31 to be inspected by storage battery inspection device 10 is a lithium battery or a lithium ion battery or the like. Storage battery 31 includes a pair of electrode terminals 32 and 33. Each of electrode terminals 32 and 33 is connected to power supply 23 via a conductive wire. Measurer 21 measures the magnetic field via magnetic sensor 12 while power supply 23 is applying an alternating current to storage battery 31.

Note that a specific example of storage battery inspection device 10 illustrated in FIG. 1 is not limited to the example illustrated in FIG. 3. For example, some elements may be omitted and other components may be added. Some or all of measurer 21, power supply section 23, display 17, and information processor 24 illustrated in FIG. 3 may have an integrated structure.

Figure 4:
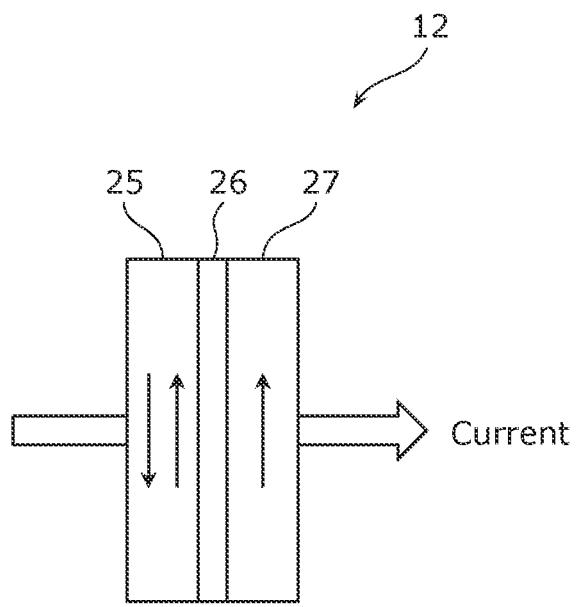
FIG. 4 is a schematic diagram illustrating the structure of a magnetic sensor according to an embodiment of the present disclosure in detail.

FIG. 4 is a schematic diagram illustrating the structure of magnetic sensor 12 illustrated in FIG. 3 in detail. Magnetic sensor 12 includes a tunneling magneto resistive (TMR) element.

In a TMR element, an insulating film is sandwiched between magnetic films having a thickness of 10 nm to 100 nm. More specifically, the TMR element includes a plurality of thin films including soft layer 25, tunnel layer 26, and PIN layer (magnetization fixing layer) 27. Soft layer 25 is a magnetic film whose direction of magnetization changes according to the direction of magnetization of the external field. PIN layer 27 is a magnetic film whose direction of magnetization does not change. Tunnel layer 26 is an insulating film.

The electrical resistance when the direction of magnetization in soft layer 25 and the direction of magnetization in PIN layer 27 are the same differs from the electrical resistance when those directions are different. This change in electrical resistance is used to sense the magnetic field component.

For example, magnetic sensor 12 uses the above characteristic to sense and measure the magnetic field component. Note that magnetic sensor 12 is not limited to the above example of a TMR element, and may also include other elements such as a giant magneto resistive (GMR) element or a superconducting quantum interference device (SQUID) element.

Figure 5:
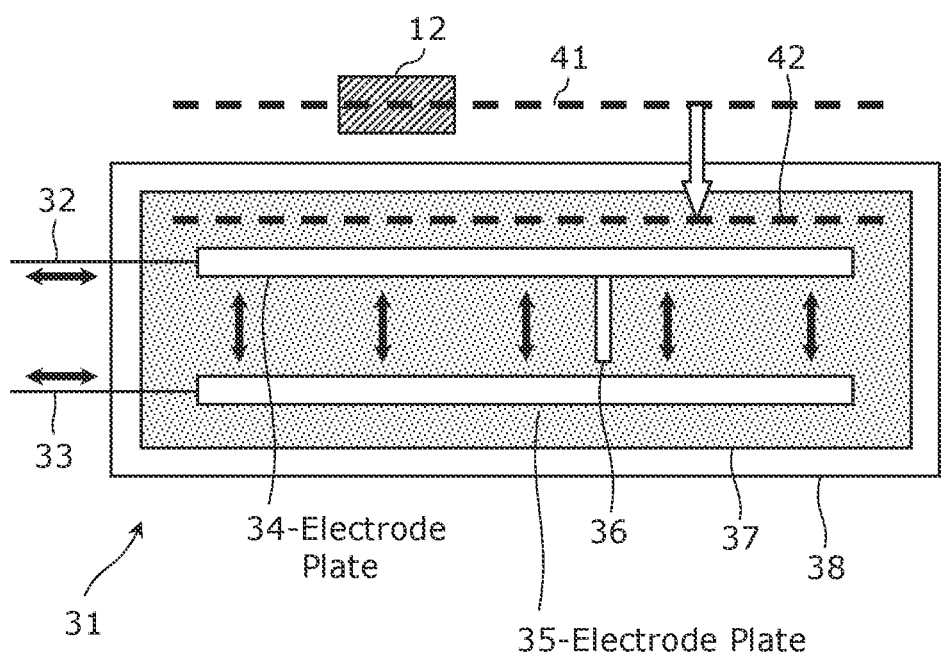
FIG. 5 is a schematic diagram illustrating the inspection of a storage battery according to an embodiment of the present disclosure.

FIG. 5 is a schematic diagram illustrating the inspection of storage battery 31 illustrated in FIG. 3. Storage battery 31 illustrated in FIG. 5 includes a pair of electrode terminals 32 and 33, a pair of electrode plates 34 and 35, electrolyte 37, and metal package 38. The pair of electrode plates 34 and 35 and electrolyte 37 are covered by metal package 38.

For example, magnetic sensor 12 senses a magnetic field component at each of a plurality of positions in scan target plane 41 above storage battery 31 placed on rotating table 22. Scan target plane 41 is also referred to as a measurement plane. Magnetic sensor 12 may be moved sequentially to a plurality of positions in scan target plane 41 to sense the magnetic field components. This provides information on the magnetic field components of scan target plane 41.

For example, magnetic sensor 12 may sense a magnetic field component at each of a plurality of positions in a plurality of scan target planes 41. More specifically, magnetic sensor 12 may sense a magnetic field component at each of a plurality of positions in one scan target plane 41, and then magnetic sensor 12 may sense a magnetic field component at each of a plurality of positions in another scan target plane 41. This provides information on the magnetic field of each scan target plane 41.

Furthermore, information on the magnetic field of reconstructed target plane 42, which is a plane different than the plurality of scan target planes 41, may be calculated from the information on the magnetic fields of the plurality of scan target planes 41. For example, reconstructed target plane 42 may be a surface corresponding to the upper surface of electrode plate 34. More specifically, the information on the magnetic field of reconstructed target plane 42 may be calculated using the information on the magnetic field of the plurality of scan target planes 41 and Maxwell's equations. A distribution of conductivity in storage battery 31 may be calculated using the information on the magnetic fields of scan target planes 41 or reconstructed target plane 42, and Maxwell's equations.

The calculation process as described above may be performed by information processor 24 illustrated in FIG. 3, by the image generation and processing circuitry of FIG. 1, or by other elements.

The current flowing inside storage battery 31 generates a magnetic field component outside of storage battery 31. Magnetic sensor 12 senses a magnetic field component generated outside of storage battery 31 by the current flowing inside storage battery 31. If the current flowing inside storage battery 31 changes, the magnetic field component outside of storage battery 31 also changes.

For example, during the charging/discharging processes of storage battery 31, dendrites 36 may form and grow inside storage battery 31 due to metal deposition on electrode plate 34 or electrode plate 35.

The conductivity of dendrites 36 is high compared to the conductivity of electrolyte 37. Therefore, if dendrites 36 form inside storage battery 31, the electrical state inside storage battery 31 will change. This causes the magnetic field component outside of storage battery 31 to change as well. For example, storage battery inspection device 10 can inspect the state of formation and growth of dendrites 36 by sensing a magnetic field component outside of storage battery 31.

As the electrical state inside storage battery 31 changes with the formation and growth of dendrites 36, the magnetic field component outside of storage battery 31 also changes. It takes time to sense the magnetic field components at multiple locations outside of storage battery 31, and it is therefore not easy to sense the magnetic field components, which change over time, over a wide area and with high resolution.

Stopping the charging/discharging of storage battery 31 inhibits the generation and growth of dendrite 36, and also inhibits a change in the electrical state inside storage battery 31. However, in a state in which the charging/discharging of storage battery 31 is stopped, a magnetic field component based on the electrical state inside storage battery 31 is not generated. It is therefore difficult to inspect the state of formation and growth of dendrites 36 in this state.

In view of this, storage battery inspection device 10 applies an alternating current to storage battery 31 by applying an external voltage in which the alternating voltage is superimposed on the direct voltage for balancing the output voltage of storage battery 31. As a result, alternating current flows in storage battery 31 in a state in which the formation and growth of dendrites 36 are inhibited. The alternating current flowing in storage battery 31 generates a magnetic field component based on the electrical state inside storage battery 31.

Storage battery inspection device 10 can inspect the state of formation and growth of dendrites 36 by sensing a magnetic field component generated by the alternating current flowing in storage battery 31. Storage battery inspection device 10 can extract a magnetic field component that is based on the electrical state inside storage battery 31 by extracting a magnetic field component corresponding to the frequency of the alternating current. Therefore, storage battery inspection device 10 can properly inspect the electrical state inside storage battery 31.

However, when the frequency of the alternating current is high, the magnetic field component generated by the alternating current is shielded by shielding parts such as electrode plates 34 and 35 and metal package 38, and does not leak outside storage battery 31. Therefore, for example, a frequency lower than a predetermined frequency is used for the alternating voltage and alternating current. Here, the predetermined frequency is expressed as $1/(n\sigma_s \mu_s d_s^2)$, where $\sigma_s$ is the conductivity of the shielding part, $p_s$ is the permeability of the shielding part, and $d_s$ the thickness of the shielding part. With this, a magnetic field component is generated outside of storage battery 31.

A frequency lower than the predetermined frequency and higher than ½ of the predetermined frequency may be used in order to inhibit the effect of charging/discharging and to shorten the measurement time of the magnetic field component corresponding to the frequency of the alternating current. Alternatively, a frequency lower than the predetermined frequency and higher than ⅒th of the predetermined frequency may be used. Conversely, in order to more reliably generate a magnetic field component outside storage battery 31, a frequency lower than ½ of the predetermined frequency or a frequency lower than ⅒th of the predetermined frequency may be used.

Figure 6:
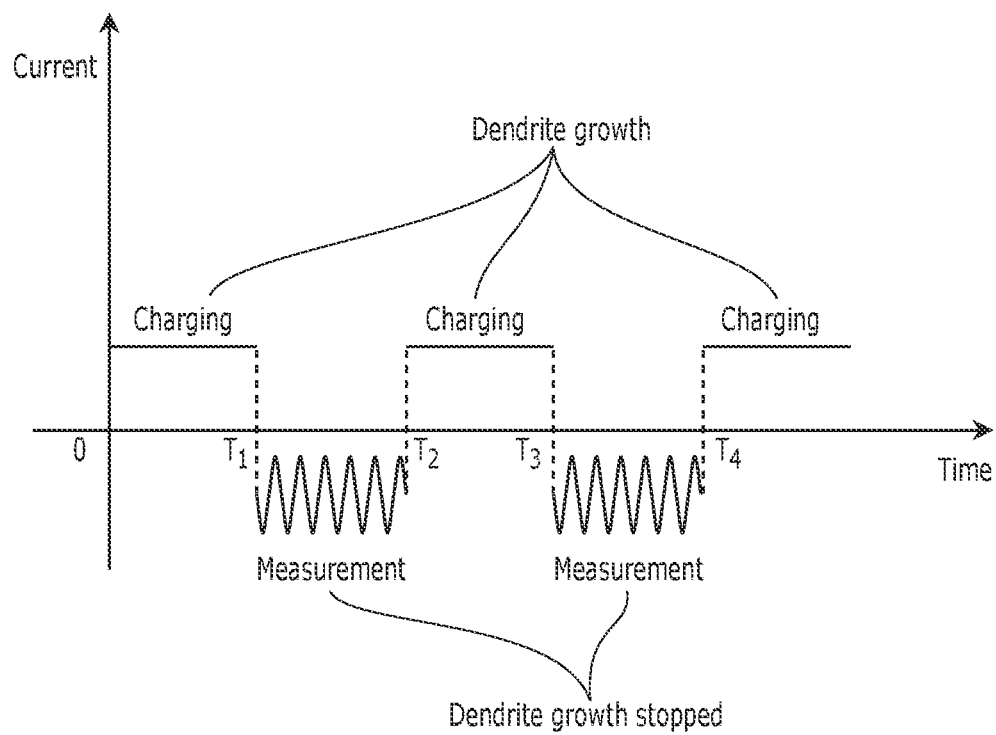
FIG. 6 is a graph illustrating the transition of the current applied to the storage battery according to an embodiment of the present disclosure.

FIG. 6 is a graph illustrating the transition of the current applied to storage battery 31 illustrated in FIG. 3. In this example, storage battery inspection device 10 applies a direct current to storage battery 31 by applying a direct voltage for charging storage battery 31 to storage battery 31 until time $T_1$. From time $T_1$ to time $T_2$, storage battery inspection device 10 applies an alternating current to storage battery 31 by applying a superimposed voltage of the alternating voltage and the direct voltage for balancing the output voltage of storage battery 31.

From time $T_2$ to time $T_3$, storage battery inspection device 10 applies a direct current to storage battery 31 by applying a direct voltage for charging storage battery 31 to storage battery 31. From time $T_3$ to time $T_4$, storage battery inspection device 10 applies an alternating current to storage battery 31 by applying a superimposed voltage of the alternating voltage and the direct voltage for balancing. From time $T_4$, storage battery inspection device 10 applies a direct current to storage battery 31 by applying a direct voltage for charging storage battery 31 to storage battery 31.

This charges storage battery 31 until time $T_1$. From time $T_1$ to time $T_2$, the charging of storage battery 31 is then inhibited. From time $T_2$ to time $T_3$, storage battery 31 is charged again. From time $T_3$ to time $T_4$, the charging of storage battery 31 is inhibited again. From time $T_4$, storage battery 31 is charged yet again.

Dendrites 36 grow during the charging periods. The growth of dendrites 36 is stopped during the periods when charging is inhibited. Storage battery inspection device 10 senses magnetic field components around storage battery 31 during the periods when the growth of dendrites 36 is stopped. Stated differently, storage battery inspection device 10 senses magnetic field components around storage battery 31 while an alternating current is being applied to storage battery 31.

Figure 7:
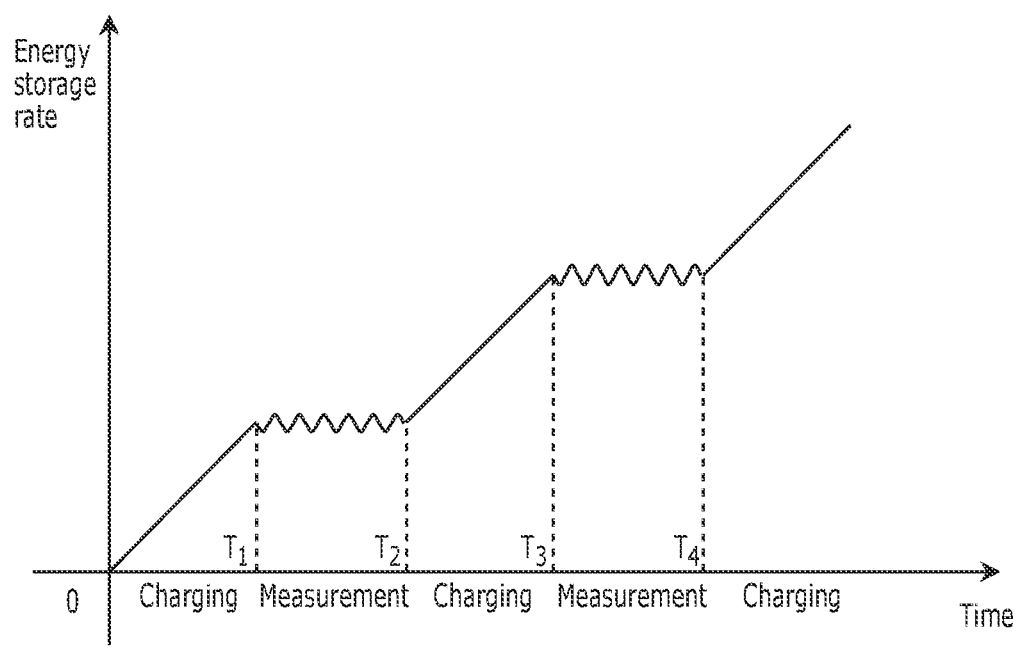
FIG. 7 is a graph illustrating the transition of the energy storage rate of the storage battery according to an embodiment of the present disclosure.

FIG. 7 is a graph illustrating the transition of the energy storage rate of storage battery 31 illustrated in FIG. 3. The example in FIG. 7 corresponds to the example in FIG. 6. In FIG. 7, energy storage rate is used on the vertical axis instead of current. As illustrated in FIG. 6, the energy storage rate increases during charging periods. In periods when charging is inhibited, the energy storage rate is inhibited from increasing. Storage battery inspection device 10 can inspect the growth of dendrites 36 at a point in the middle of the charging process by sensing the magnetic field component during periods when the energy storage rate is inhibited from increasing.

In each of the plurality of periods when the energy storage rate is inhibited from increasing in the charging process, storage battery inspection device 10 may sense a magnetic field component and generate an image indicating the state of storage battery 31 based on the sensed magnetic field component. Stated differently, storage battery inspection device 10 may generate a plurality of images corresponding to a plurality of points in the middle of the charging process. This enables storage battery inspection device 10 to generate images of the growth process of dendrites 36.

Although FIG. 6 and FIG. 7 show transitions corresponding to the charging process, storage battery inspection device 10 can perform the same operations in the discharge process. Storage battery 31 may be inspected regardless of whether it is in a charging/discharging process or not. Stated differently, regardless of whether storage battery 31 is in a charging/discharging process or not, storage battery inspection device 10 may apply an alternating current to storage battery 31, sense a magnetic field component outside of storage battery 31, and generate an image indicating the state of storage battery 31 based on the sensed magnetic field component.

Figure 8:
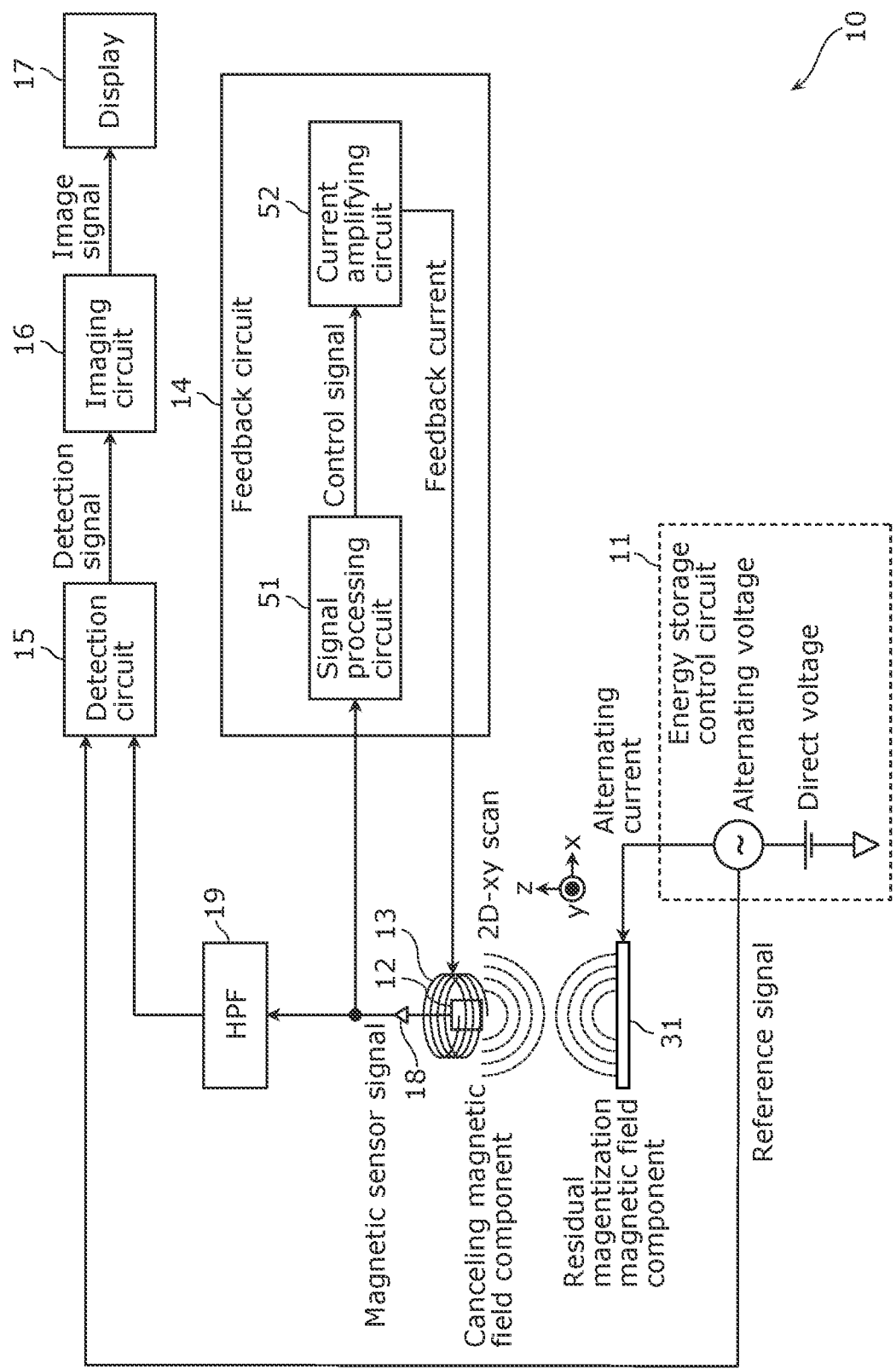
FIG. 8 is a schematic diagram illustrating the overall configuration of the storage battery inspection device according to an embodiment of the present disclosure.

FIG. 8 is a schematic diagram illustrating the overall configuration of storage battery inspection device 10 illustrated in FIG. 1. Energy storage control circuit 11 applies a superimposed voltage of an alternating voltage and a direct voltage to storage battery 31. The direct voltage is a voltage for balancing the output voltage of storage battery 31 (also referred to as a release voltage), and is an offset voltage to maintain the charge state of storage battery 31. More specifically, the magnitude of the direct voltage is the same as the magnitude of the output voltage of storage battery 31. This inhibits the charging/discharging of storage battery 31.

An alternating current is applied to storage battery 31 as a result of applying the superimposed voltage of the alternating voltage and the direct voltage to storage battery 31. For example, an alternating current of approximately 0.1 Hz to 10 Hz is applied to storage battery 31. The alternating current applied to storage battery 31 generates a magnetic field component outside of storage battery 31.

Magnetic sensor 12 senses the magnetic field component generated outside of storage battery 31. Magnetic sensor 12 scans on a two-dimensional plane perpendicular to the direction toward storage battery 31.

The residual magnetization of the magnetic material included in storage battery 31 also generates a magnetic field component outside storage battery 31. When magnetic sensor 12 is affected by the magnetic field component generated by the residual magnetization of the magnetic material included in storage battery 31, it becomes difficult for magnetic sensor 12 to properly sense the magnetic field component generated by the alternating current applied to storage battery 31.

In view of this, canceling coil 13 generates a magnetic field component based on the input current to cancel out the magnetic field component generated by the residual magnetization. Here, the input current is the current applied to canceling coil 13 by feedback circuit 14. This input current is also referred to as a feedback current.

Feedback circuit 14 includes signal processing circuit 51 and current amplifying circuit 52. Signal processing circuit 51 obtains the magnetic sensor signal that is output from magnetic sensor 12 and amplified by preamplifier 18, and outputs a control signal to current amplifying circuit 52. For example, signal processing circuit 51 obtains, from the magnetic sensor signal, a low-frequency signal indicating a magnetic field component having a frequency lower than the frequency of the alternating current. Signal processing circuit 51 then outputs a control signal indicating the magnitude of the feedback current to be applied to canceling coil 13, based on the low-frequency signal.

More specifically, signal processing circuit 51 outputs a control signal indicating, as the magnitude of the feedback current, a value that increases with an increase in the magnetic field component that the low-frequency signal indicates as a magnetic field component having a frequency lower than the frequency of the alternating current.

Current amplifying circuit 52 applies, to canceling coil 13, the feedback current of the magnitude indicated by the control signal output from signal processing circuit 51. This generates, based on a magnetic field component having a frequency lower than the frequency of the alternating current, a magnetic field component to cancel out the magnetic field component generated by the residual magnetization.

The magnetic field component generated by the residual magnetization is assumed to consist of a magnetic field component having a frequency lower than the frequency of the alternating current. Storage battery inspection device 10 can therefore generate a magnetic field component equivalent to the magnetic field component generated by the residual magnetization by generating a magnetic field component based on the magnetic field component having a frequency lower than the frequency of the alternating current. Storage battery inspection device 10 can therefore properly cancel out the magnetic field component generated by the residual magnetization.

Detection circuit 15 obtains a magnetic sensor signal from magnetic sensor 12. For example, detection circuit 15 obtains, from magnetic sensor 12, a magnetic sensor signal which is amplified and from which low-frequency components have been removed by preamplifier 18 and high-pass filter 19. Detection circuit 15 obtains a reference signal from energy storage control circuit 11. Here, the reference signal indicates the voltage or current applied to storage battery 31.

More specifically, the reference signal may be an analog signal having the same frequency and phase as the alternating voltage superimposed on the direct voltage in energy storage control circuit 11 or the alternating current applied to storage battery 31. The reference signal may be the same as the alternating current signal applied to storage battery 31. Stated differently, the reference signal may be an analog signal of the same voltage and current as the voltage and current applied to storage battery 31. Alternatively, the reference signal may be an analog signal or a digital signal that indicates information on the voltage or current applied to storage battery 31.

Then, based on the magnetic sensor signal and the reference signal, detection circuit 15 obtains, as the detection signal, a signal indicating a magnetic field component having the same frequency as the frequency of the alternating current applied to storage battery 31.

Imaging circuit 16 generates an image showing the state of storage battery 31 based on the detection signal obtained by detection circuit 15. This image may show, as the state of storage battery 31, a magnetic field component near the surface of storage battery 31 or the distribution of conductivity in storage battery 31. Imaging circuit 16 then outputs an image signal indicating the generated image to display 17.

Display 17 displays an image showing the state of storage battery 31, based on the image signal output from imaging circuit 16.

Figure 9:
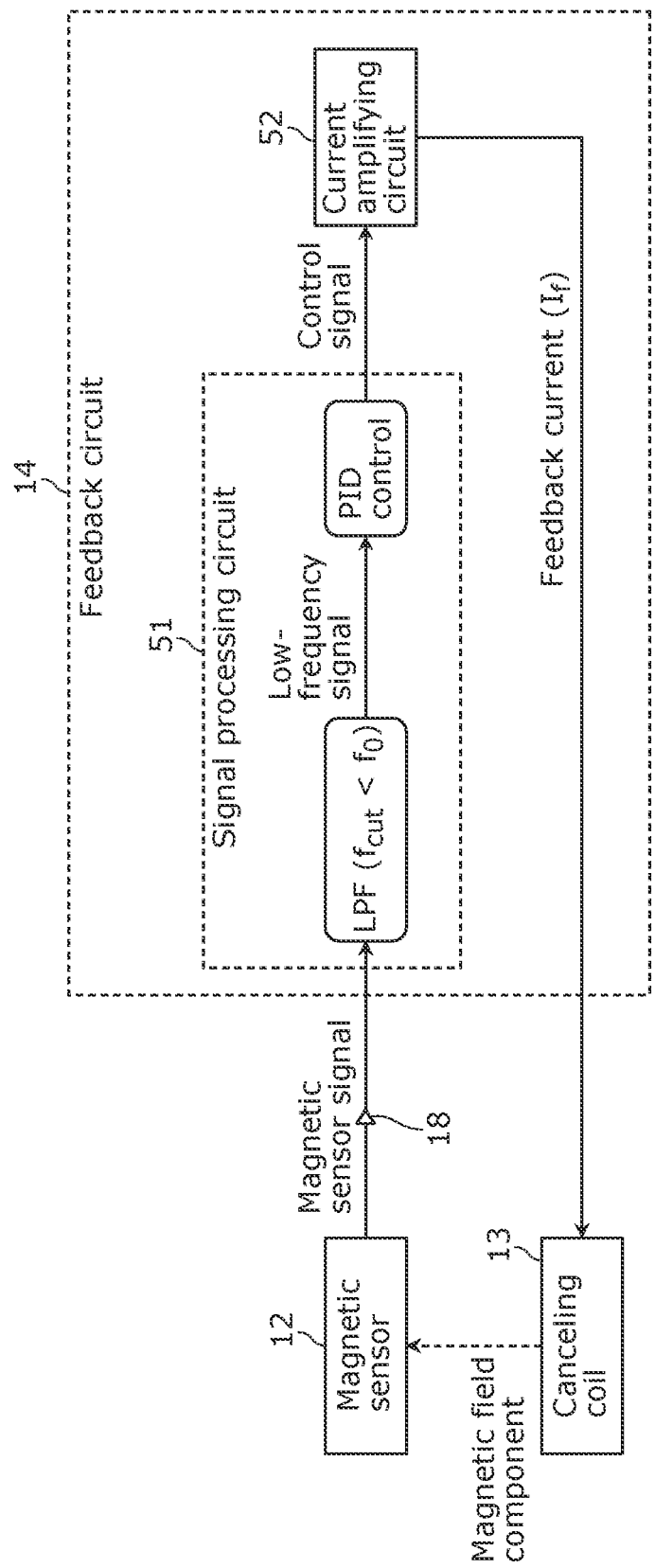
FIG. 9 is a block diagram illustrating the configuration of a feedback circuit according to an embodiment of the present disclosure.

FIG. 9 is a block diagram illustrating the configuration of feedback circuit 14 illustrated in FIG. 8. As illustrated in FIG. 9, magnetic sensor 12 senses a magnetic field component and outputs a magnetic sensor signal indicating the sensed magnetic field component. For example, the strength of the magnetic sensor signal is proportional to the strength of the magnetic field component; the stronger the magnetic field component, the stronger the output magnetic sensor signal is, and the frequency characteristics of the magnetic sensor signal match the frequency characteristics of the magnetic field component.

Signal processing circuit 51 in feedback circuit 14 applies a low-pass filter (LPF) to the magnetic sensor signal output from magnetic sensor 12 and amplified by preamplifier 18. A lower frequency than the detection frequency ($f_0$) is applied to the cutoff frequency ($f_{cut}$) of the low-pass filter. The cutoff frequency of a low-pass filter is also known as a corner frequency. The detection frequency is the frequency of the alternating current applied to storage battery 31.

This allows signal processing circuit 51 to obtain a low-frequency signal indicating a magnetic field component having a frequency lower than the frequency of the alternating current applied to storage battery 31.

If the cutoff frequency of the low-pass filter is too low, the low-pass filter may take a long time to process. For example, a processing delay corresponding to the period of the cutoff frequency (the reciprocal of the cutoff frequency) may occur. The cutoff frequency may therefore be stipulated to be approximately the same frequency as the detection frequency.

On the other hand, it is assumed that errors occur in the process of low-pass filtering or in the processing related to the sensing of magnetic field components. Therefore, the cutoff frequency may be specified to be $\frac{1}{10}$th of the detection frequency so that the detection (obtainment of a magnetic field component having the same frequency as the frequency of the alternating current) is properly performed even if an error occurs. Alternatively, the cutoff frequency may be specified to be $\frac{1}{10}$th or more of the detection frequency based on a balance between error and delay.

This enables signal processing circuit 51 to properly obtain the low-frequency signal indicating a magnetic field component having a frequency lower than the frequency of the alternating current flowing in storage battery 31 while inhibiting a processing delay in the low-pass filter.

Signal processing circuit 51 then generates a control signal for bringing the strength of the low-frequency signal closer to a target value by way of proportional-integral-differential (PID) control. For example, the control signal indicates the magnitude of the feedback current (If) for bringing the strength of the low-frequency signal closer to the target value.

PID control is feedback control that uses the deviation between the measured value and the target value, the integral of the deviation, and the differential of the deviation to bring the continuously obtained measured value closer to the target value. For example, the target value may be the strength of the low-frequency signal obtained while the strength of the magnetic field component is zero.

The above operation, in which the magnitude of the feedback current is controlled by PID control, has been explained with focus on the strength of the signal. If we focus on the strength of the magnetic field component, the above operation can be regarded as an operation to bring the strength of the magnetic field component indicated by the low-frequency signal closer to the target value. The target value in this case may be zero. Here, the strength of the magnetic field component sensed by magnetic sensor 12 may be specified as zero when storage battery 31 is not present or when storage battery 31 does not generate a magnetic field component.

For example, signal processing circuit 51 generates a control signal indicating the magnitude of the feedback current to bring the strength of the magnetic field component indicated by the low-frequency signal closer to zero. Then, signal processing circuit 51 outputs a control signal to current amplifying circuit 52, and current amplifying circuit 52 applies a feedback current to canceling coil 13 in accordance with the control signal.

This enables storage battery inspection device 10 to bring the strength of a magnetic field component having a frequency lower than the frequency of the alternating current applied to storage battery 31 and lower than the cutoff frequency of the low-pass filter closer to zero. In other words, storage battery inspection device 10 can cancel out the magnetic field component generated by the magnetization of the magnetic material included in storage battery 31.

Figure 10:
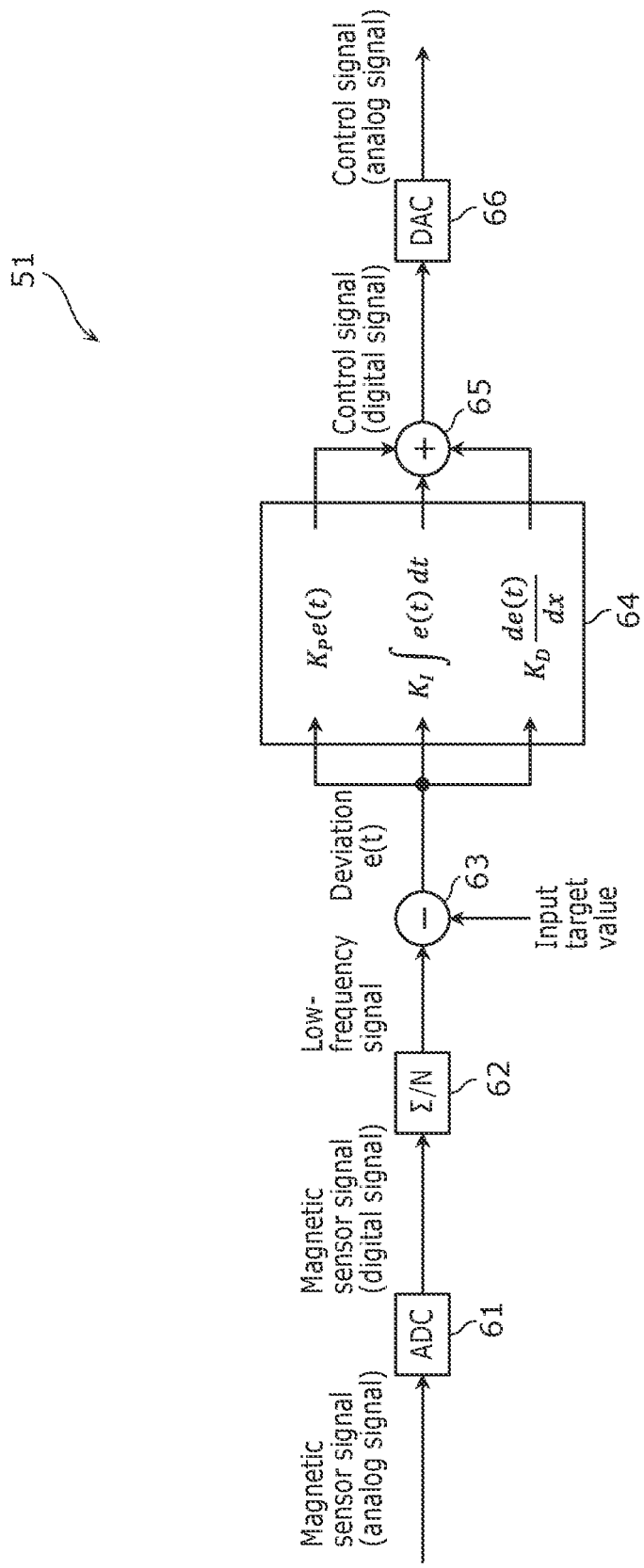
FIG. 10 is a block diagram illustrating the configuration of a signal processing circuit according to an embodiment of the present disclosure.

FIG. 10 is a block diagram illustrating the configuration of signal processing circuit 51 illustrated in FIG. 9. In the example illustrated in FIG. 10, signal processing circuit 51 includes analog-to-digital converter (ADC) 61, low-pass filter 62, subtractor 63, PID calculator 64, adder 65, and digital-to-analog converter (DAC) 66.

ADC 61 is a converter for converting an analog signal to a digital signal. A 16-bit AD converter or the like can be used as ADC 61. ADC 61 obtains the magnetic sensor signal output from magnetic sensor 12 as an analog signal, and converts the magnetic sensor signal obtained as an analog signal into a digital signal.

Low-pass filter 62 is a filter that blocks components having frequencies higher than the cutoff frequency and passes components having frequencies lower than the cutoff frequency. A frequency lower than the frequency of the alternating current applied to storage battery 31 is used as the cutoff frequency of low-pass filter 62. For example, low-pass filter 62 may average the magnetic sensor signal over a period of time longer than the reciprocal of the detection frequency, that is, longer than the period of the alternating current applied to storage battery 31, and output the averaged magnetic sensor signal.

As a result, low-pass filter 62 can pass components of the magnetic sensor signal that have frequencies lower than the frequency of the alternating current. Stated differently, this causes a low-frequency signal indicating a magnetic field component having a frequency lower than the frequency of the alternating current applied to storage battery 31 to be output from low-pass filter 62. The period of time for averaging the magnetic sensor signals is also called the integration time.

Here, blocking components having frequencies higher than the cutoff frequency means inhibiting the passage of components having frequencies higher than the cutoff frequency, and is not limited to completely blocking components having frequencies higher than the cutoff frequency. Similarly, passing components having frequencies lower than the cutoff frequency means inhibiting the blocking of components having frequencies lower than the cutoff frequency, and is not limited to completely passing components having frequencies lower than the cutoff frequency. The degree of blocking and passing depends on the quality of low-pass filter 62.

Low-pass filter 62 may block or pass components that are the same as the cutoff frequency, or block part of the components that are the same as the cutoff frequency and pass the other part.

Subtractor 63 is a calculator that calculates the difference between the two signals. More specifically, subtractor 63 calculates the difference obtained by subtracting the low-frequency signal output from low-pass filter 62 from the input target value as deviation e(t). Here, t is time. The input target value is a low-frequency signal in a state in which the strength of the magnetic field component is zero.

PID calculator 64 is a calculator that calculates the proportional term, integral term, and differential term of the deviation. More specifically, PID calculator 64 calculates a proportional term of deviation e(t), an integral term of deviation e(t) with respect to time t, and a differential term of deviation e(t) with respect to time t. The proportional term consists of the multiplication of deviation e(t) and proportional gain Kp. The integral term consists of the multiplication of the integral of deviation e(t) with respect to time t and integral gain Ki. The differential term consists of the multiplication of the differential of deviation e(t) with respect to time t and differential gain $K_D$.

The proportional term corresponds to deviation e(t) itself and is related to the current value of deviation e(t). The integral term corresponds to the accumulation of deviation e(t) and is related to the actual value of deviation e(t) in the past. The differential term corresponds to the change in deviation e(t) and is related to the predicted value of deviation e(t) in the future.

Adder 65 is a calculator that calculates the sum of a plurality of signals. More specifically, adder 65 calculates, as a control signal, a sum of a proportional term of deviation e(t), an integral term of deviation e(t) with respect to time t, and a differential term of deviation e(t) with respect to time t.

DAC 66 is a converter for converting a digital signal to an analog signal. A 16-bit DA converter or the like can be used as DAC 66. DAC 66 obtains the control signal calculated by adder 65 as a digital signal and converts the control signal obtained as a digital signal into an analog signal.

The control signal converted to an analog signal by DAC 66 is input to current amplifying circuit 52. This allows current amplifying circuit 52 to apply a feedback current of a magnitude corresponding to the sum of the proportional, integral, and differential terms of the deviation to canceling coil 13.

This enables storage battery inspection device 10 to converge deviation e(t) to zero according to the proportional, integral, and differential terms corresponding to the current, actual, and predicted values of deviation e(t). Storage battery inspection device 10 can then bring the strength of the magnetic field component having a frequency lower than the frequency of the alternating current closer to zero, thereby inhibiting the effect of the residual magnetization of storage battery 31.

For example, zero or a numerical value other than zero may be used for each of proportional gain Kp, integral gain Ki and differential gain $K_D$ in the above description. More specifically, zero may be used for differential gain $K_D$ so that the PID control is performed as PI control. Additionally, zero may be used for integral gain Ki so that the PID control is performed as PD control.

In the above description, a digital circuit system is used for the low-pass filter and PID control of signal processing circuit 51. However, an analog circuit system may be used for the low-pass filter and PID control of signal processing circuit 51.

In other words, low-pass filter 62, subtractor 63, PID calculator 64 and adder 65 may be constructed from analog circuits. In such cases, signal processing circuit 51 may apply a low-pass filter and PID control to the magnetic sensor signal as an analog signal without converting the magnetic sensor signal into a digital signal. This enables storage battery inspection device 10 to control the feedback current at high speed with analog signals.

Figure 11:
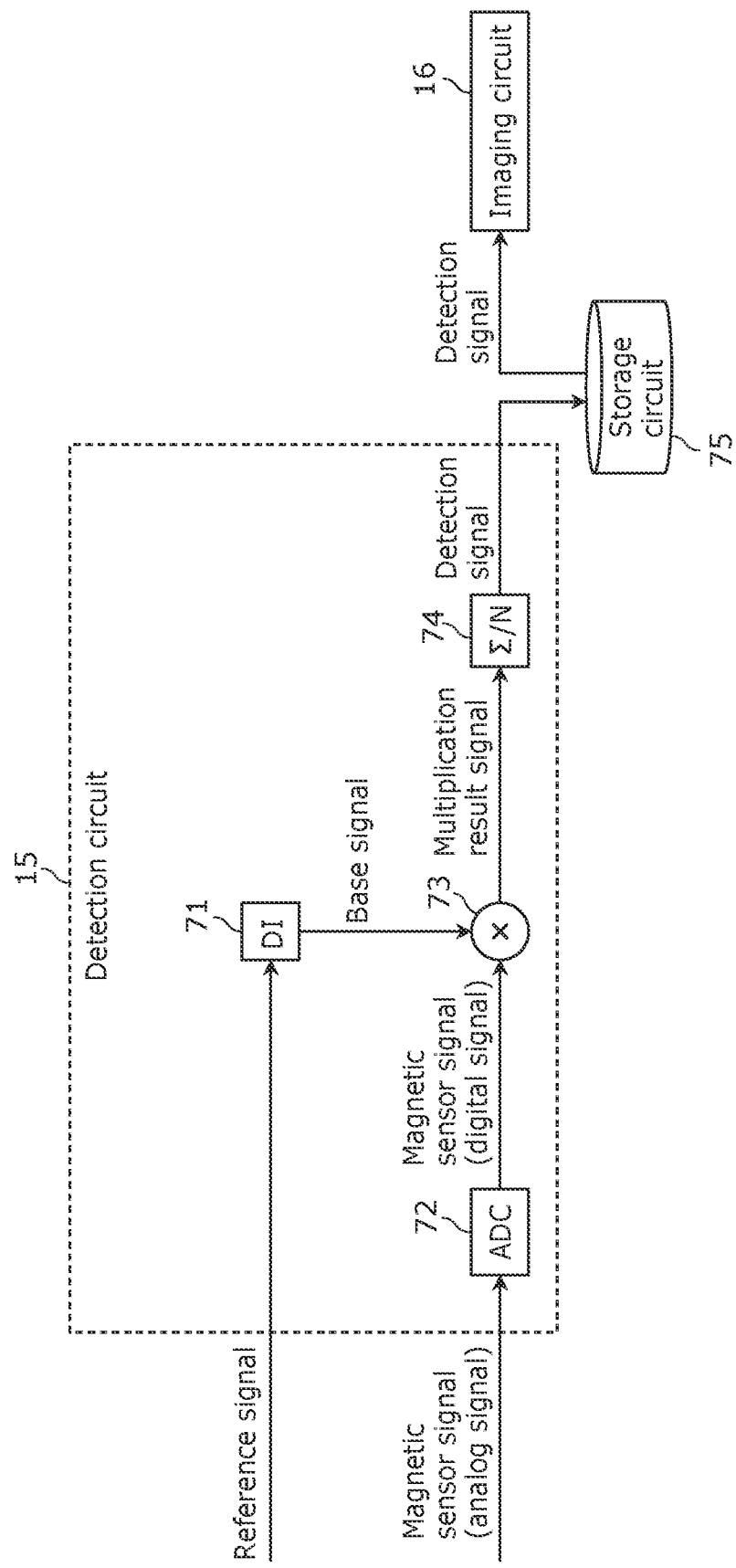
FIG. 11 is a block diagram illustrating the configuration of a detection circuit according to an embodiment of the present disclosure.

FIG. 11 is a block diagram illustrating the configuration of detection circuit 15 illustrated in FIG. 8. In the example illustrated in FIG. 11, detection circuit 15 includes direct injection box (DI) 71, analog-to-digital converter (ADC) 72, mixer 73, and low-pass filter 74, and performs phase detection. Although phase detection is given as an example here, detection circuit 15 may acquire the detection signal in other ways.

DI 71 is an impedance converter. More specifically, DI 71 obtains a reference signal output from energy storage control circuit 11, adjusts the ratio of the voltage and current of the reference signal, and generates a base signal for phase detection. For example, DI 71 generates the base signal as a digital signal.

ADC 72 is a converter for converting an analog signal to a digital signal. A 16-bit AD converter or the like can be used as ADC 72. ADC 72 obtains the magnetic sensor signal output from magnetic sensor 12 as an analog signal, and converts the magnetic sensor signal obtained as an analog signal into a digital signal.

Mixer 73 is a circuit that mixes a plurality of signals. More specifically, mixer 73 performs multiplication of the reference signal generated by DI 71 and the magnetic sensor signal converted to a digital signal by ADC 72, and outputs the result of the multiplication as the multiplication result signal. The direct current component of the multiplication result signal corresponds to the magnetic field component having the same frequency as the frequency of the alternating current.

Low-pass filter 74 is a filter that blocks components having frequencies higher than the cutoff frequency and passes components having frequencies lower than the cutoff frequency. Low-pass filter 74 obtains the multiplication result signal, blocks the alternating current component of the multiplication result signal, and passes the direct current component of the multiplication result signal. As a result, low-pass filter 74 outputs a detection signal corresponding to a magnetic field component having the same frequency as the frequency of the alternating current.

Detection circuit 15 stores the detection signal in storage circuit 75. In the above example, a digital circuit system is applied to detection circuit 15, but an analog circuit system may be applied to detection circuit 15. Stated differently, detection circuit 15 may acquire a detection signal indicating a magnetic field component having the same frequency as the alternating current by performing detection process on the magnetic sensor signal as an analog signal.

Imaging circuit 16 generates an image showing the state of storage battery 31 based on the detection signal stored in storage circuit 75. Imaging circuit 16 may generate an image showing the distribution of conductivity inside storage battery 31 as the state of storage battery 31. Hereinafter, an example of imaging circuit 16 deriving the distribution of conductivity inside storage battery 31 will be given with reference to FIG. 12 and FIG. 13.

Figure 12:
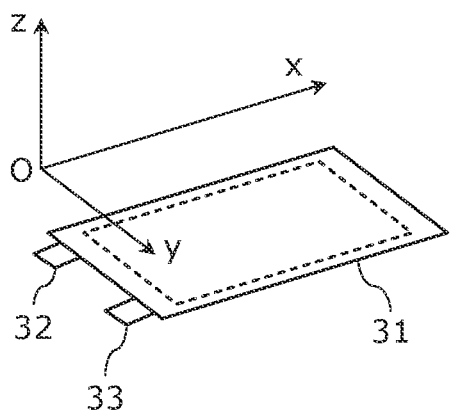
FIG. 12 is a schematic diagram illustrating a coordinate system for the imaging performed in an embodiment of the present disclosure.

FIG. 12 is a schematic diagram illustrating a coordinate system for the imaging performed by imaging circuit 16 illustrated in FIG. 11. FIG. 12 illustrates the relationship between storage battery 31 and the coordinate system. The x direction and the y direction are two directions that are parallel to the planar electrode plates included in storage battery 31 and perpendicular to each other. The z direction is a direction perpendicular to the x direction and the y direction.

Figure 13:
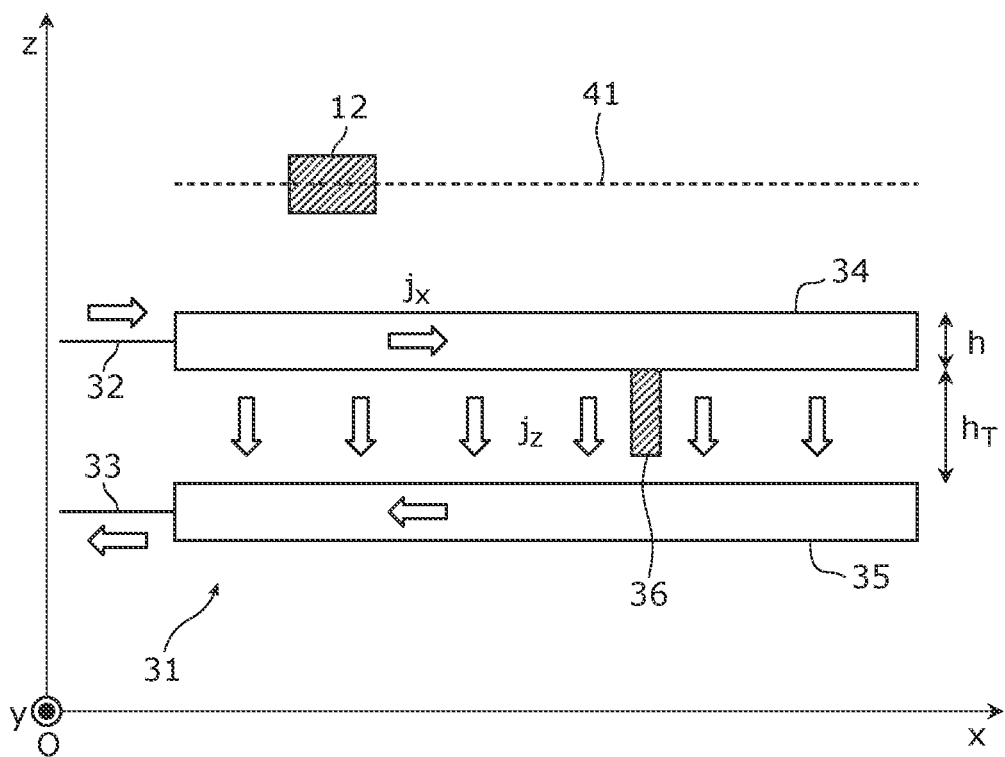
FIG. 13 is a schematic diagram illustrating the current flowing during inspection of the storage battery according to an embodiment of the present disclosure.

FIG. 13 is a schematic diagram illustrating the current flowing during inspection of storage battery 31 illustrated in FIG. 12. Storage battery 31 corresponds to a single layer lithium ion battery cell and includes a pair of planar electrode plates 34 and 35.

Electrode plate 34 is connected to electrode terminal 32, and electrode plate 35 is connected to electrode terminal 33. Storage battery inspection device 10 senses the magnetic field component via magnetic sensor 12 in scan target plane 41 above storage battery 31 while the alternating current is flowing in storage battery 31.

Here, h is the thickness of electrode plate 34, $h_T$ is the distance between the pair of electrode plates 34 and 35, $j_x$ is the current in the x direction, and $j_z$ is the current in the z direction.

In this case, the equations in (1) shown below hold true.

[Math. 1]

$$\Delta H_x = h_T^{-1} h \partial_y \{\sigma(x,y)\varphi(x,y)\} \delta(z-z_0) - \sigma_0 h \{\partial_y \varphi(x,y)\} \delta'(z-z_0)$$

$$\Delta H_y = -h_T^{-1} h \partial_x \{\sigma(x,y)\varphi(x,y)\} \delta(z-z_0) + \sigma_0 h \{\partial_x \varphi(x,y)\} \delta'(z-z_0)$$

$$\partial_x^2 \varphi + \partial_y^2 \varphi = (\sigma_0 h h_T)^{-1} \sigma(x,y) \varphi(x,y) \quad (1)$$

Here, $\Delta$ is an operator referred to as the Laplace operator or Laplacian, $H_x$ is the magnetic field component in the x direction, $H_y$ is the magnetic field component in the y direction, $\partial_x$ is the partial differential for x, $\partial_y$ is the partial differential for y, $\sigma(x, y)$ is the distribution of conductivity in a two-dimensional plane between the pair of electrode plates 34 and 35, $\sigma_0$ is the conductivity of electrode plate 34, which is constant regardless of the x coordinate and the y coordinate, $\delta$ is a delta function, $\delta'$ is a differential of the delta function, and $z_0$ is the z coordinate of the center of electrode plate 34.

Moreover, $$\varphi(x,y) \quad \text{[Math. 2]}$$

indicates the distribution of potential in a two-dimensional plane between the pair of electrode plates 34 and 35.

The equations in (2) shown below are obtained based on the equations in (1) shown above.

[Math. 3]

$$\tilde{\varphi}(k_x, k_y) = \frac{2\{ik_y Q_x(k_x, k_y, z_0) - ik_x Q_y(k_x, k_y, z_0)\}}{hk^2 \sigma_0 (hk-1)} \quad (2)$$

$$\sigma(x, y) = hh_T \sigma_0 \frac{(\partial_x^2 + \partial_y^2)\varphi}{\varphi}$$

$$k = \sqrt{k_x^2 + k_y^2}$$

[Math. 4]

$$\tilde{\varphi}(k_x, k_y)$$

indicates a function after the Fourier transform for the x and y directions of the following:

$$\varphi(x,y) \quad \text{[Math. 5]}$$

where $k_x$ is the wavenumber of the magnetic field component in the x direction, $k_y$ is the wavenumber of the magnetic field component in the y direction, $Q_x$ is a function after Fourier transform for the x and y directions of $H_x$, and $Q_y$ is a function after Fourier transform for the x and y directions of $H_y$.

Furthermore, $Q_x$ and $Q_y$ satisfy the equations in (3) shown below.

[Math. 6]

$$Q_x(k_x, k_y, z_0) = \frac{1}{2}\left\{Q_x(k_x, k_y, z_1) - \frac{1}{\sqrt{k_x^2+k_y^2}}\partial_z Q_x(k_x, k_y, z_1)\right\}e^{(z_1-z_0)\sqrt{k_x^2+k_y^2}}$$

$$Q_y(k_x, k_y, z_0) = \frac{1}{2}\left\{Q_y(k_x, k_y, z_1) - \frac{1}{\sqrt{k_x^2+k_y^2}}\partial_z Q_y(k_x, k_y, z_1)\right\}e^{(z_1-z_0)\sqrt{k_x^2+k_y^2}}$$

(3)

For example, imaging circuit 16 uses the equations in (2) and (3) to derive the distribution of conductivity σ(x, y) from the detection signal indicating the magnetic field component generated by the alternating current, and generates an image indicating the distribution of conductivity σ(x, y).

Imaging circuit 16 may derive the distribution of conductivity in a different manner than described above. Imaging circuit 16 may generate an image showing the distribution of intensity of the magnetic field component indicated by the detection signal without deriving the distribution of conductivity.

Figure 14:
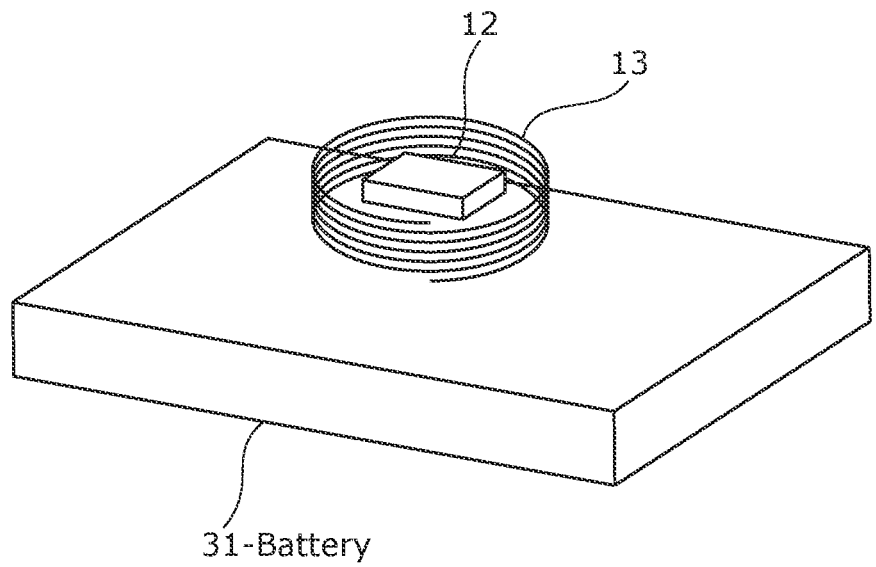
FIG. 14 is a schematic diagram illustrating an example in which a magnetic sensor that senses a magnetic field component in a direction perpendicular to the planar electrode plates included in the storage battery according to an embodiment of the present disclosure is positioned inside a canceling coil.

FIG. 14 is a schematic diagram illustrating an example in which magnetic sensor 12 that senses a magnetic field component in a direction perpendicular to the planar electrode plates included in storage battery 31 illustrated in FIG. 8 is positioned inside canceling coil 13.

In the example illustrated in FIG. 14, magnetic sensor 12 is positioned inside canceling coil 13. As a result, canceling coil 13 can generate a magnetic field component at the position of magnetic sensor 12 to cancel out the magnetic field component generated by the magnetization of the magnetic material included in storage battery 31. Accordingly, storage battery inspection device 10 can cancel out the magnetic field component generated by the magnetization of the magnetic material included in storage battery 31 at the position of magnetic sensor 12, and can thus properly sense the magnetic field component generated by the alternating current power.

Moreover, in the example illustrated in FIG. 14, the central axis of canceling coil 13 is perpendicular to the planar electrode plates included in storage battery 31.

With this, canceling coil 13 can generate a magnetic field component in a direction perpendicular to the planar electrode plates included in storage battery 31 as a magnetic field component to cancel out the magnetic field component generated by the magnetization of the magnetic material included in storage battery 31. Accordingly, storage battery inspection device 10 can, with respect to the direction perpendicular to the planar electrode plates included in storage battery 31, cancel out the magnetic field component generated by the magnetization of the magnetic material included in storage battery 31, and can thus properly sense the magnetic field component generated by the alternating current power.

Additionally, storage battery inspection device 10 is capable of properly detecting a magnetic field component that is affected when, for example, there is a hole in an electrical conductor of storage battery 31 due to a crack, for example.

Figure 15:
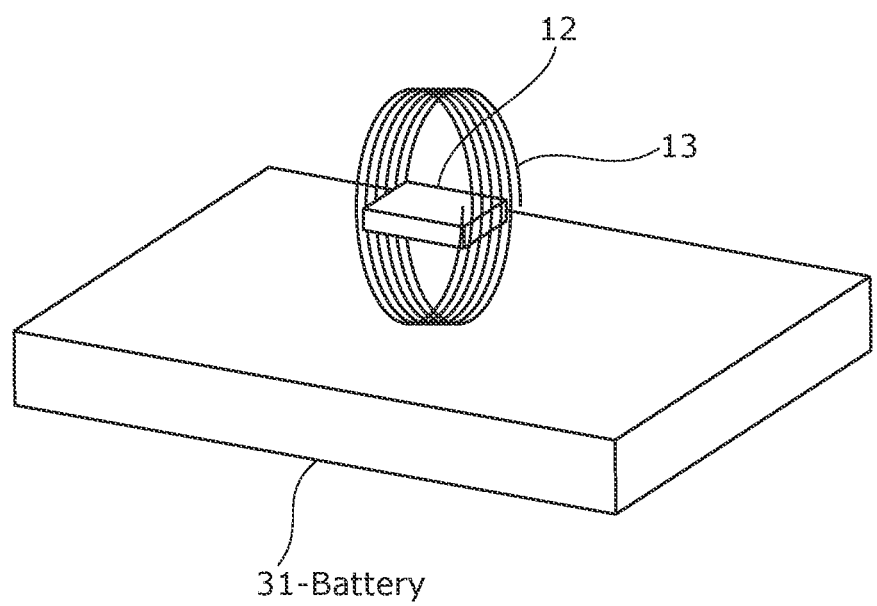
FIG. 15 is a schematic diagram illustrating an example in which a magnetic sensor that senses a magnetic field component in a direction parallel to the planar electrode plates included in the storage battery according to an embodiment of the present disclosure is positioned inside a canceling coil.

FIG. 15 is a schematic diagram illustrating an example in which magnetic sensor 12 that senses a magnetic field component in a direction parallel to the planar electrode plates included in storage battery 31 illustrated in FIG. 8 is positioned inside canceling coil 13.

Just like in the example illustrated in FIG. 14, magnetic sensor 12 is positioned inside canceling coil 13 in the example illustrated in FIG. 15 as well. As a result, canceling coil 13 can generate a magnetic field component at the position of magnetic sensor 12 to cancel out the magnetic field component generated by the magnetization of the magnetic material included in storage battery 31. Accordingly, storage battery inspection device 10 can efficiently cancel out the magnetic field component generated by the magnetization of the magnetic material included in storage battery 31 at the position of magnetic sensor 12, and can thus properly sense the magnetic field component generated by the alternating current power.

Moreover, in the example illustrated in FIG. 15, the central axis of canceling coil 13 is parallel to the planar electrode plates included in storage battery 31.

With this, canceling coil 13 can generate a magnetic field component in a direction parallel to the planar electrode plates included in storage battery 31 as a magnetic field component to cancel out the magnetic field component generated by the magnetization of the magnetic material included in storage battery 31. Accordingly, storage battery inspection device 10 can, with respect to the direction parallel to the planar electrode plates included in storage battery 31, cancel out the magnetic field component generated by the magnetization of the magnetic material included in storage battery 31, and can thus properly sense the magnetic field component generated by the alternating current power.

In particular, it is assumed that a magnetic field component in a direction parallel to the planar electrode plates included in storage battery 31 is generated outside storage battery 31 to which the alternating current is applied. It is therefore useful to cancel out the magnetic field component generated by the magnetization of the magnetic material included in storage battery 31 with respect to the direction parallel to the planar electrode plates included in storage battery 31 when sensing the magnetic field component generated by the alternating current power.

Figure 16:
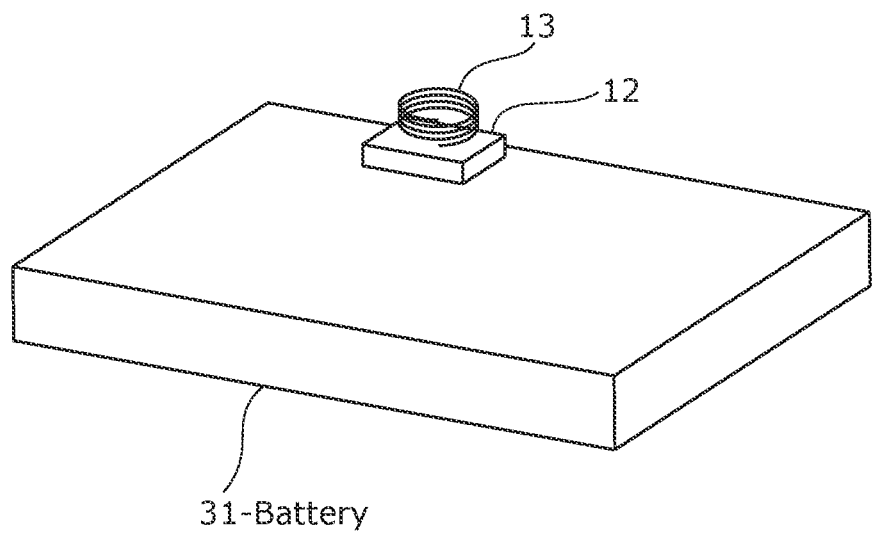
FIG. 16 is a schematic diagram illustrating an example in which a magnetic sensor that senses a magnetic field component in a direction perpendicular to the planar electrode plates included in the storage battery according to an embodiment of the present disclosure is positioned outside a canceling coil.

FIG. 16 is a schematic diagram illustrating an example in which magnetic sensor 12 that senses a magnetic field component in a direction perpendicular to the planar electrode plates included in storage battery 31 illustrated in FIG. 8 is positioned outside canceling coil 13.

In the example illustrated in FIG. 16, magnetic sensor 12 is positioned outside canceling coil 13. More specifically, canceling coil 13 is disposed in the vicinity of magnetic sensor 12. With this configuration as well, canceling coil 13 can generate a magnetic field component at a distance from magnetic sensor 12 to cancel out the magnetic field component generated by the magnetization of the magnetic material included in storage battery 31. This configuration allows for more flexible positioning of canceling coil 13.

In the example illustrated in FIG. 16, magnetic sensor 12 is positioned in a region on the central axis of canceling coil 13.

Accordingly, canceling coil 13 can generate a magnetic field component in a direction toward magnetic sensor 12 to cancel out the magnetic field component generated by the magnetization of the magnetic material included in storage battery 31. Accordingly, canceling coil 13 can generate a magnetic field component in the vicinity of magnetic sensor 12 to cancel out the magnetic field component generated by the magnetization of the magnetic material included in storage battery 31.

Moreover, just like in the example illustrated in FIG. 14, the central axis of canceling coil 13 is perpendicular to the planar electrode plates included in storage battery 31 in the example illustrated in FIG. 16 as well.

With this, canceling coil 13 can generate a magnetic field component in a direction perpendicular to the planar electrode plates included in storage battery 31 as a magnetic field component to cancel out the magnetic field component generated by the magnetization of the magnetic material included in storage battery 31. Accordingly, storage battery inspection device 10 can, with respect to the direction perpendicular to the planar electrode plates included in storage battery 31, cancel out the magnetic field component generated by the magnetization of the magnetic material included in storage battery 31, and can thus properly sense the magnetic field component generated by the alternating current power.

Figure 17:
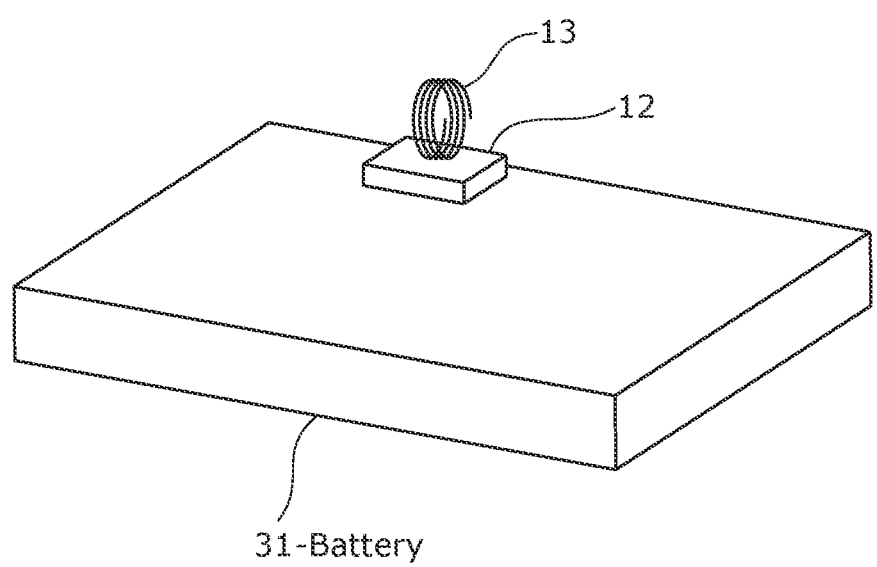
FIG. 17 is a schematic diagram illustrating an example in which a magnetic sensor that senses a magnetic field component in a direction parallel to the planar electrode plates included in the storage battery according to an embodiment of the present disclosure is positioned outside a canceling coil.

FIG. 17 is a schematic diagram illustrating an example in which magnetic sensor 12 that senses a magnetic field component in a direction parallel to the planar electrode plates included in storage battery 31 illustrated in FIG. 8 is positioned outside canceling coil 13.

Just like in the example illustrated in FIG. 16, magnetic sensor 12 is positioned outside canceling coil 13 in the example illustrated in FIG. 17 as well. More specifically, canceling coil 13 is disposed in the vicinity of magnetic sensor 12. With this configuration as well, canceling coil 13 can generate a magnetic field component at a distance from magnetic sensor 12 to cancel out the magnetic field component generated by the magnetization of the magnetic material included in storage battery 31. This configuration allows for more flexible positioning of canceling coil 13.

In the example illustrated in FIG. 17, magnetic sensor 12 is positioned in a region other than a region on the central axis of canceling coil 13. This configuration allows for more flexible orientation of the central axis of canceling coil 13. Accordingly, storage battery inspection device 10 can generate, at a distance from magnetic sensor 12, a magnetic field component in a flexibly definable direction as a magnetic field component to cancel out the magnetic field component generated by the magnetization of the magnetic material included in storage battery 31.

Moreover, just like in the example illustrated in FIG. 15, the central axis of canceling coil 13 is parallel to the planar electrode plates included in storage battery 31 in the example illustrated in FIG. 17 as well.

With this, canceling coil 13 can generate a magnetic field component in a direction parallel to the planar electrode plates included in storage battery 31 as a magnetic field component to cancel out the magnetic field component generated by the magnetization of the magnetic material included in storage battery 31. Accordingly, storage battery inspection device 10 can, with respect to the direction parallel to the planar electrode plates included in storage battery 31, cancel out the magnetic field component generated by the magnetization of the magnetic material included in storage battery 31, and can thus properly sense the magnetic field component generated by the alternating current power.

Figure 18:
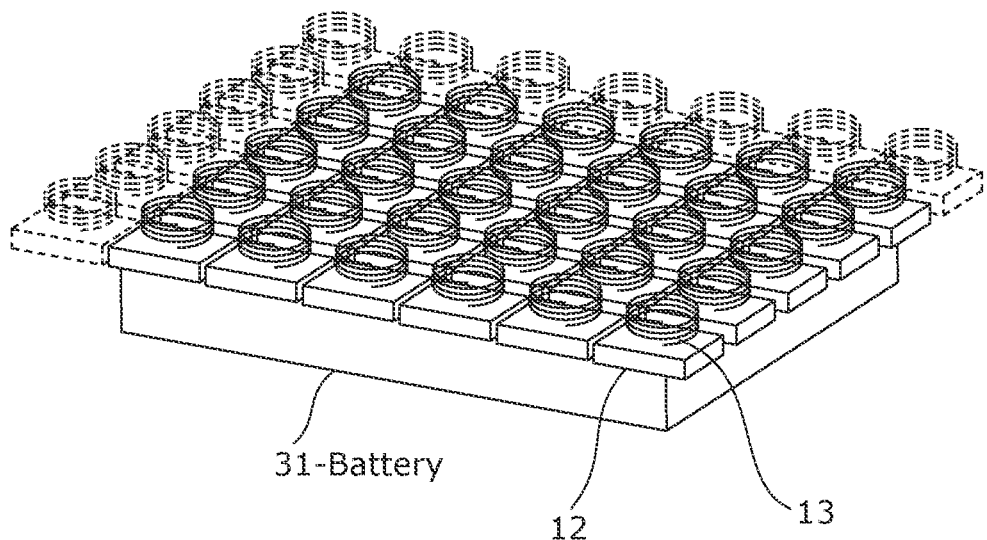
FIG. 18 is a schematic diagram illustrating an example in which a plurality of magnetic sensors sense a magnetic field component in a direction perpendicular to the planar electrode plates included in the storage battery according to an embodiment of the present disclosure.

FIG. 18 is a schematic diagram illustrating an example in which a plurality of magnetic sensors 12 sense a magnetic field component in a direction perpendicular to the planar electrode plates included in storage battery 31 illustrated in FIG. 8.

In the example illustrated in FIG. 18, storage battery inspection device 10 includes a plurality of magnetic sensors 12 and a plurality of canceling coils 13 respectively corresponding to the plurality of magnetic sensors 12. More specifically, the plurality of canceling coils 13 correspond one-to-one to the plurality of magnetic sensors 12. Feedback circuit 14 of storage battery inspection device 10 obtains a low-frequency signal from the magnetic sensor signal output from each magnetic sensor 12 and applies a feedback current based on the low-frequency signal to the canceling coil 13 corresponding to that magnetic sensor 12.

This enables storage battery inspection device 10 to properly sense a wide range of magnetic field components in a short period of time.

Moreover, in the example illustrated in FIG. 18, the plurality of magnetic sensors 12 are arranged in a matrix to cover the top surface of storage battery 31. Stated differently, the plurality of magnetic sensors 12 are arranged in a matrix on the measurement plane. The plurality of canceling coils 13 that respectively correspond to the plurality of magnetic sensors 12 are arranged above the plurality of magnetic sensors 12. The central axis of each canceling coil 13 is perpendicular to the planar electrode plates included in storage battery 31.

With this, each canceling coil 13 can generate a magnetic field component in a direction perpendicular to the planar electrode plates included in storage battery 31 as a magnetic field component to cancel out the magnetic field component generated by the magnetization of the magnetic material included in storage battery 31. Accordingly, storage battery inspection device 10 can, with respect to the direction perpendicular to the planar electrode plates included in storage battery 31, cancel out the magnetic field component generated by the magnetization of the magnetic material included in storage battery 31, and can thus properly sense the magnetic field component generated by the alternating current power.

Figure 19:
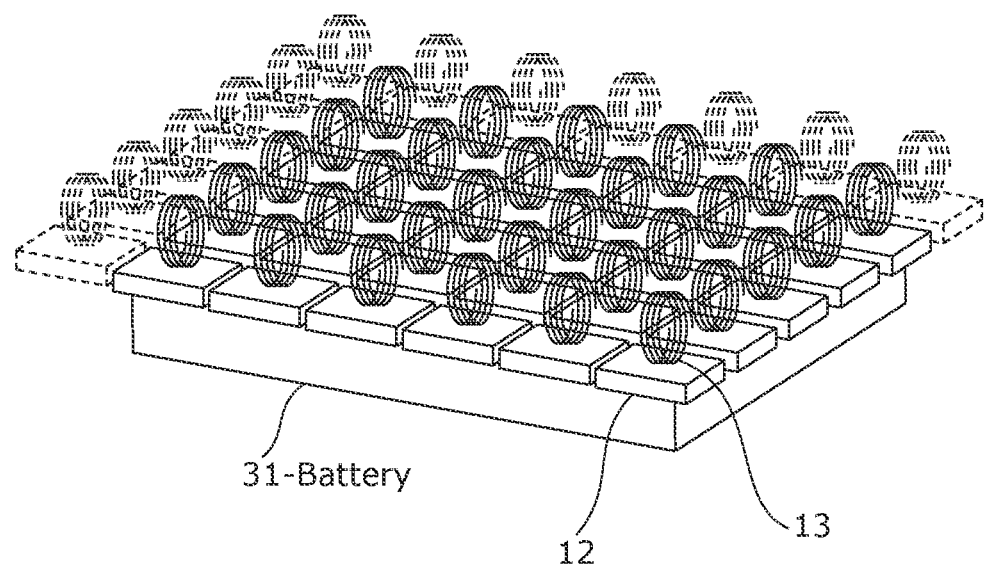
FIG. 19 is a schematic diagram illustrating an example in which a plurality of magnetic sensors sense a magnetic field component in a direction parallel to the planar electrode plates included in the storage battery according to an embodiment of the present disclosure.

FIG. 19 is a schematic diagram illustrating an example in which a plurality of magnetic sensors 12 sense a magnetic field component in a direction parallel to the planar electrode plates included in storage battery 31 illustrated in FIG. 8.

The example illustrated in FIG. 19 is approximately the same as the example in FIG. 18 but differs in that the central axis of each canceling coil 13 is parallel to the planar electrode plates included in storage battery 31.

With this, each canceling coil 13 can generate a magnetic field component in a direction parallel to the planar electrode plates included in storage battery 31 as a magnetic field component to cancel out the magnetic field component generated by the magnetization of the magnetic material included in storage battery 31. Accordingly, storage battery inspection device 10 can, with respect to the direction parallel to the planar electrode plates included in storage battery 31, cancel out the magnetic field component generated by the magnetization of the magnetic material included in storage battery 31, and can thus properly sense the magnetic field component generated by the alternating current power.

Figure 20:
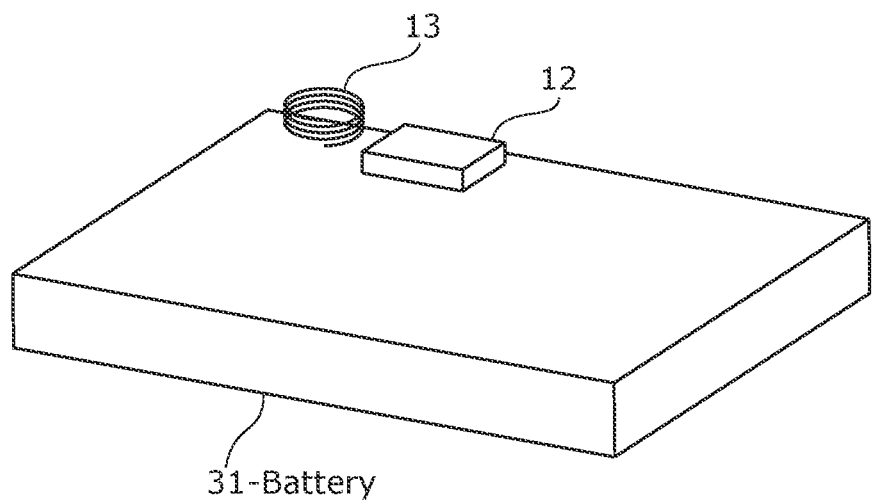
FIG. 20 is a schematic diagram illustrating an example in which a magnetic sensor that senses a magnetic field component in a direction parallel to the planar electrode plates included in the storage battery according to an embodiment of the present disclosure is positioned outside a canceling coil and the central axis of the canceling coil is perpendicular to the electrode plates.

FIG. 20 is a schematic diagram illustrating an example in which magnetic sensor 12 that senses a magnetic field component in a direction parallel to the planar electrode plates included in storage battery 31 illustrated in FIG. 8 is positioned outside canceling coil 13 and the central axis of canceling coil 13 is perpendicular to the electrode plates.

Just like in the examples illustrated in FIG. 16 and FIG. 17, magnetic sensor 12 is positioned outside canceling coil 13 in the example illustrated in FIG. 20 as well. More specifically, canceling coil 13 is disposed diagonally upward of magnetic sensor 12. With this configuration as well, canceling coil 13 can generate a magnetic field component at a distance from magnetic sensor 12 to cancel out the magnetic field component generated by the magnetization of the magnetic material included in storage battery 31. This configuration allows for more flexible positioning of canceling coil 13.

Figure 21:
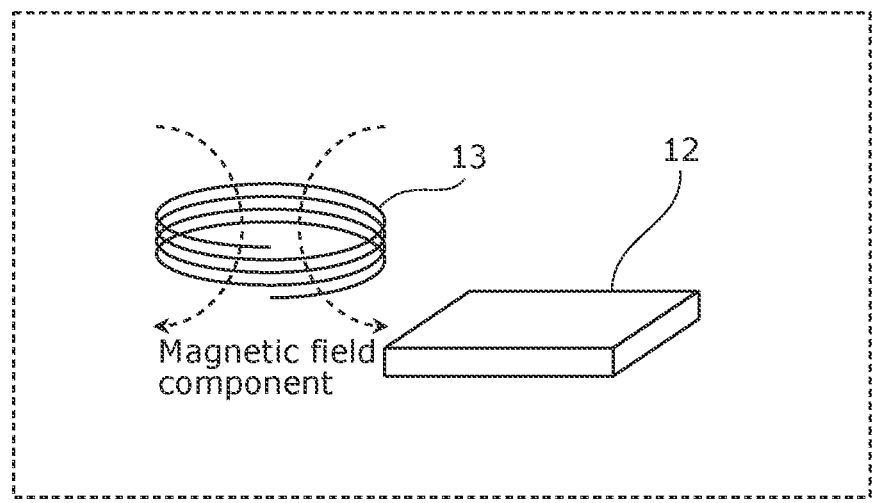
FIG. 21 is a schematic diagram illustrating an example in which the wrap-around of a magnetic field component according to an embodiment of the present disclosure is utilized.

FIG. 21 is a schematic diagram illustrating an example in which the wrap-around of a magnetic field component according to an embodiment is utilized, and more specifically illustrates the relationship between magnetic sensor 12 and canceling coil 13 illustrated in FIG. 20. As illustrated in FIG. 21, canceling coil 13 generates a magnetic field component in the direction parallel to the electrode plates in the vicinity of magnetic sensor 12.

In other words, canceling coil 13 can generate a magnetic field component in a direction parallel to the planar electrode plates included in storage battery 31 as a magnetic field component to cancel out the magnetic field component generated by the magnetization of the magnetic material included in storage battery 31. Accordingly, storage battery inspection device 10 can, with respect to the direction parallel to the planar electrode plates included in storage battery 31, cancel out the magnetic field component generated by the magnetization of the magnetic material included in storage battery 31, and can thus properly sense the magnetic field component generated by the alternating current power.

Hereinbefore, an aspect of the storage battery inspection device has been described based on an embodiment, but aspects of the storage battery inspection device are not limited to the embodiment. Various modifications conceivable by those skilled in the art may be made to the embodiment, and elements in the embodiment may be combined discretionarily. For example, a process executed by a specific element in the embodiment may be executed by a different element instead. Moreover, the processing order of the processes may be changed, and the processes may be performed in parallel.

A storage battery inspection method including steps performed by the elements included in the storage battery inspection device may be executed by an arbitrary device or system. For example, part or all of the storage battery inspection method may be executed by a computer including, for example, a processor, memory, and an input/output circuit. In such cases, the storage battery inspection method may be executed by a program for causing a computer to execute the storage battery inspection method being executed by the computer.

The program may be recorded on a non-transitory computer-readable recording medium.

Each of the elements of the storage battery inspection device may be configured in the form of dedicated hardware, in the form of general-purpose hardware that executes the above program or the like, or any combination thereof. For example, the general-purpose hardware may be configured in the form of memory on which a program is recorded and a general-purpose processor that reads the program from the memory and executes the program. Here, the memory may be semiconductor memory or a hard disk, and the general-purpose processor may be a central processing unit (CPU) or the like.

The dedicated hardware may be configured in the form of memory and a dedicated processor or the like. For example, the dedicated processor may reference the memory for recording the measurement data and execute the storage battery inspection method described above.

Each of the elements of the storage battery inspection device may be an electrical circuit. The electrical circuits may collectively form a single electrical circuit and, alternatively, may form individual electrical circuits. These electrical circuits may correspond to dedicated hardware or general-purpose hardware that executes the above program, for example.

INDUSTRIAL APPLICABILITY

One aspect of the present disclosure is useful as a storage battery inspection device that inspects a storage battery, and is applicable in, for example, storage battery manufacturing systems.

REFERENCE SIGNS LIST 10 storage battery inspection device
11 energy storage control circuit
12 magnetic sensor
13 canceling coil
14 feedback circuit
15 detection circuit
16 imaging circuit
17 display
18 preamplifier
19 high-pass filter (HPF)
21 measurer
22 rotating table
23 power supply
24 information processor
25 soft layer
26 tunnel layer
27 PIN layer (magnetization fixing layer)
31 storage battery
32, 33 electrode terminal
34, 35 electrode plate
36 dendrite
37 electrolyte
38 metal package
41 scan target plane
42 reconstructed target plane
51 signal processing circuit
52 current amplifying circuit
61, 72 analog-to-digital converter (ADC)
62, 74 low-pass filter
63 subtractor
64 PID calculator
65 adder
66 digital-to-analog converter (DAC)
71 direct injection box (DI)
73 mixer
75 storage circuit

The invention claimed is:

1. A storage battery inspection device that inspects a storage battery, the storage battery inspection device comprising:
an energy storage control circuit that applies an alternating current to the storage battery by applying an external voltage in which an alternating voltage is superimposed on a direct voltage for balancing an output voltage of the storage battery;

a magnetic sensor that senses a sensed magnetic field component outside the storage battery and outputs a magnetic sensor signal indicating the sensed magnetic field component;

a canceling coil that generates a canceling magnetic field component based on an input current to cancel out a magnetic material generated magnetic field component generated by magnetization of a magnetic material included in the storage battery;

a feedback circuit that obtains, from the magnetic sensor signal output from the magnetic sensor while the alternating current is being applied to the storage battery, a low-frequency signal indicating a low-frequency magnetic field component having a frequency lower than a frequency of the alternating current, and applies the input current to the canceling coil based on the low-frequency signal; and a detection circuit that obtains, from the magnetic sensor signal output from the magnetic sensor while the alternating current is being applied to the storage battery and the input current is being applied to the canceling coil, a detection signal indicating a same-frequency magnetic field component having a same frequency as the frequency of the alternating current.

2. The storage battery inspection device according to claim 1, wherein the feedback circuit obtains the low-frequency signal from the magnetic sensor signal via a low-pass filter that blocks components having frequencies higher than a cutoff frequency and passes components having frequencies lower than the cutoff frequency, and the cutoff frequency is lower than the frequency of the alternating current.

3. The storage battery inspection device according to claim 2, wherein the cutoff frequency is at least 1/10th of the frequency of the alternating current.

4. The storage battery inspection device according to claim 1, wherein the feedback circuit uses a proportional-integral-differential (PID) control method to control a magnitude of the input current to bring a strength of the low frequency magnetic field component indicated by the low-frequency signal closer to a target value, and applies the input current of the controlled magnitude to the canceling coil.

5. The storage battery inspection device according to claim 4, wherein the target value is zero.

6. The storage battery inspection device according to claim 1, wherein the feedback circuit includes:
a signal processing circuit that obtains the low-frequency signal from the magnetic sensor signal output from the magnetic sensor while the alternating current is being applied to the storage battery, and outputs a control signal indicating a magnitude of the input current based on the low-frequency signal; and
a current amplifying circuit that applies the input current of the magnitude indicated by the control signal to the canceling coil.

7. The storage battery inspection device according to claim 6, wherein the signal processing circuit converts the magnetic sensor signal output from the magnetic sensor as an analog signal into a digital signal, obtains the low-frequency signal from the magnetic sensor signal converted into a digital signal, generates the control signal based on the low-frequency signal, converts the generated control signal into an analog signal, and outputs the control signal converted into an analog signal.

8. The storage battery inspection device according to claim 6, wherein the signal processing circuit obtains the low-frequency signal from the magnetic sensor signal output from the magnetic sensor as an analog signal without converting the magnetic sensor signal output from the magnetic sensor as an analog signal into a digital signal, generates the control signal based on the low-frequency signal, and outputs the generated control signal.

9. The storage battery inspection device according to claim 1, wherein the magnetic sensor is positioned inside the canceling coil.

10. The storage battery inspection device according to claim 1, wherein the magnetic sensor is positioned outside the canceling coil.

11. The storage battery inspection device according to claim 1, wherein the magnetic sensor is positioned in a region on a central axis of the canceling coil.

12. The storage battery inspection device according to claim 1, wherein the magnetic sensor is positioned in a region other than a region on a central axis of the canceling coil.

13. The storage battery inspection device according to claim 1, wherein a central axis of the canceling coil is perpendicular to a planar electrode plate included in the storage battery.

14. The storage battery inspection device according to claim 1, wherein a central axis of the canceling coil is parallel to a planar electrode plate included in the storage battery.

15. The storage battery inspection device according to claim 1, wherein the storage battery inspection device includes:
a plurality of magnetic sensors as the magnetic sensor; and
a plurality of canceling coils respectively corresponding to the plurality of magnetic sensors, as the canceling coil, and
the feedback circuit obtains, for the plurality of magnetic sensors, the low-frequency signal from the magnetic sensor signal output from the magnetic sensor, and applies, based on the low-frequency signal, the input current to the canceling coil corresponding to the magnetic sensor among the plurality of canceling coils.

16. A storage battery inspection method of inspecting a storage battery, the storage battery inspection method comprising:

applying, with an energy storage control circuit, an alternating current to the storage battery by applying an external voltage in which an alternating voltage is superimposed on a direct voltage for balancing an output voltage of the storage battery;

while the alternating current is being applied to the storage battery, sensing with a magnetic sensor a sensed magnetic field component outside the storage battery, outputting a magnetic sensor signal indicating the sensed magnetic field component, and obtaining, with a feedback circuit, from the magnetic sensor signal output by the magnetic sensor, a low-frequency signal indicating a low-frequency magnetic field component having a frequency lower than a frequency of the alternating current;

applying, with the feedback circuit, an input current based on the low-frequency signal to a canceling coil that generates a canceling magnetic field component based on the input current to cancel out a magnetic material generated magnetic field component generated by magnetization of a magnetic material included in the storage battery; and obtaining, with a detection circuit from the magnetic sensor signal output from the magnetic sensor while the alternating current is being applied to the storage battery and the input current is being applied to the canceling coil, a detection signal indicating a same-frequency magnetic field component having a same frequency as the frequency of the alternating current.

* * * * *